(12) United States Patent
Xue et al.

(10) Patent No.: US 11,793,027 B2
(45) Date of Patent: Oct. 17, 2023

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventors: Jinxiang Xue, Beijing (CN); Xiaolei Zhang, Beijing (CN); Guoqiang Wang, Beijing (CN); Zhao Cui, Beijing (CN); Huili Wu, Beijing (CN); Zhongyuan Sun, Beijing (CN); Kai Sui, Beijing (CN); Guangcai Yuan, Beijing (CN); Wenqi Liu, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 193 days.

(21) Appl. No.: 17/478,428

(22) Filed: Sep. 17, 2021

(65) Prior Publication Data
US 2022/0093896 A1 Mar. 24, 2022

(30) Foreign Application Priority Data
Sep. 22, 2020 (CN) .......................... 202011001204.9

(51) Int. Cl.
*H10K 50/844* (2023.01)
*H10K 71/00* (2023.01)

(52) U.S. Cl.
CPC .......... *H10K 50/844* (2023.02); *H10K 71/00* (2023.02)

(58) Field of Classification Search
None
See application file for complete search history.

(56) References Cited

U.S. PATENT DOCUMENTS

2020/0227681 A1* 7/2020 Jin .................. H10K 59/12

FOREIGN PATENT DOCUMENTS

| CN | 101154350 A | * | 4/2008 | .......... G09G 3/2022 |
| CN | 102362305 B | * | 4/2015 | .......... H01L 51/0096 |
| CN | 104201289 B | * | 2/2017 | .......... H01L 27/3246 |
| WO | WO-2007034900 A1 | * | 3/2007 | .......... C09K 11/06 |

* cited by examiner

*Primary Examiner* — Michael Lebentritt
(74) *Attorney, Agent, or Firm* — Dority & Manning, P.A.

(57) ABSTRACT

A display panel includes a base; a plurality of display units disposed on a surface of the base, every two adjacent display units being provided with a gap therebetween; and a connection unit disposed in the gap and connected to the every two adjacent display units. The connection unit includes a first organic layer, a conductive layer and a second organic layer that are sequentially stacked. The first organic layer and the second organic layer are each configured to block stress causing the connection unit to deform.

20 Claims, 27 Drawing Sheets

DISPLAY PANEL AND METHOD FOR MANUFACTURING THE SAME, AND DISPLAY DEVICE

CROSS-REFERENCE TO RELATED APPLICATION

This application claims priority to Chinese Patent Application No. 202011001204.9, filed on Sep. 22, 2020, which is incorporated herein by reference in its entirety.

TECHNICAL FIELD

The present disclosure relates to the field of display technologies, and in particular, to a display panel and a method for manufacturing the same, and a display device.

BACKGROUND

Currently, bendable and foldable display panels have attracted people's attention due to their characteristic of being deformable.

SUMMARY

In an aspect, a display panel is provided. The display panel includes: a base; a plurality of display units disposed on a surface of the base, every two adjacent display units being provided with a gap therebetween; and a connection unit disposed in the gap and connected to the every two adjacent display units. The connection unit includes: a first organic layer, a conductive layer and a second organic layer that are sequentially stacked. The first organic layer and the second organic layer are each configured to block stress causing the connection unit to deform.

In some embodiments, each display unit includes: an active layer, a gate insulating layer, a gate layer and a first interlayer dielectric layer that are sequentially stacked on the base. A surface, away from the base, of the first organic layer includes a flat region. The flat region is level with a surface, away from the base, of the first interlayer dielectric layer compared with the base, or the flat region is lower than a surface, away from the base, of the first interlayer dielectric layer compared with the base, or the flat region is higher than a surface, away from the base, of the first interlayer dielectric layer compared with the base.

In some embodiments, in a case where the flat region is lower than the surface of the first interlayer dielectric layer, the surface of the first organic layer further includes first transition regions located at two opposite sides of the flat region. One end of each first transition region is connected to the flat region. Another end of the first transition region gently rises to a height level with a surface, away from the base, of a first interlayer dielectric layer of a display unit connected to the first transition region, in a direction close to the display unit, and is in contact with the surface of the first interlayer dielectric layer; or another end of the first transition region gently rises to a height greater than that of a surface, away from the base, of a first interlayer dielectric layer of a display unit connected to the first transition region, in a direction close to the display unit, and overlaps an edge of the surface of the first interlayer dielectric layer. In a case where the flat region is higher than the surface of the first interlayer dielectric layer, the surface of the first organic layer further includes second transition regions located at two opposite sides of the flat region. One end of each second transition region is connected to the flat region. Another end of the second transition region gently descends to a height level with a surface, away from the base, of a first interlayer dielectric layer of a display unit connected to the second transition region, in a direction close to the display unit, and is in contact with the surface of the first interlayer dielectric layer; or another end of the second transition region gently descends to a height greater than that of a surface, away from the base, of a first interlayer dielectric layer of a display unit connected to the second transition region, in a direction close to the display unit, and overlaps an edge of the surface of the first interlayer dielectric layer.

In some embodiments, the display unit further includes a source-drain electrode layer disposed on the surface of the first interlayer dielectric layer. The source-drain electrode layer includes a source and a drain. The conductive layer of the connection unit and the source-drain electrode layer are disposed in a same layer.

In some embodiments, the display unit further includes: a barrier layer and a buffer layer that are sequentially stacked between the base and the active layer; and/or a second interlayer dielectric layer and a capacitor electrode layer that are sequentially stacked between the gate insulating layer and the first interlayer dielectric layer.

In some embodiments, the connection unit further includes a first inorganic layer disposed on a surface, away from the base, of the second organic layer. Each display unit includes: an electroluminescent device and a second inorganic layer that are sequentially stacked. A thickness of the first inorganic layer is less than a thickness of the second inorganic layer.

In some embodiments, the second inorganic layer includes: a first inorganic sub-layer and a second inorganic sub-layer that are sequentially stacked. The display unit further includes a third organic layer disposed between the first inorganic sub-layer and the second inorganic sub-layer.

In some embodiments, the first inorganic layer and the second inorganic layer are made of a same material.

In some embodiments, the first inorganic layer and the second inorganic layer are each made of silicon oxide, silicon nitride, or silicon oxynitride.

In some embodiments, the first inorganic layer and at least a portion of the second inorganic layer are disposed in a same layer.

In some embodiments, the display unit further includes a first protective layer disposed between the electroluminescent device and the base and located beside the electroluminescent device. A surface, away from the base, of the first protective layer is provided with a plurality of grooves.

In some embodiments, the connection unit further includes a second protective layer disposed between the second organic layer and the first inorganic layer. The second protective layer and the first protective layer are disposed in a same layer.

In some embodiments, the first organic layer or the second organic layer is made of at least one of: a polymer of polymethyl methacrylate and polystyrene, a polymer and a derivative of phenol groups, a polymer of acryl, a polymer of para-xylene, a polymer of aryl ether, a polymer of amide, a polymer of fluoride, or a polymer of vinyl alcohol.

In another aspect, a method for manufacturing a display panel is provided. The method includes: providing a substrate, the substrate having: a plurality of display unit regions and a gap region between every two adjacent display unit regions, and the gap region including a connection unit region located between the every two adjacent display unit regions and connected to the every two adjacent display unit regions; forming a first organic film in the gap region between the every two adjacent display unit regions; forming a conductive layer in the connection unit region and on a surface, away from the substrate, of the first organic film: forming a second organic film in the gap region and on a surface, away from the substrate, of the conductive layer; and patterning the first organic film and the second organic film, so as to retain a portion of the first organic film located in the connection unit region to obtain a first organic layer, and to retain a portion of the second organic film located in the connection unit region to obtain a second organic layer.

In some embodiments, before the first organic film is formed in the gap region between the every two adjacent display unit regions, the method further includes: forming an active layer in each display unit region and on a side of the substrate; forming a gate insulating film on a surface, away from the substrate, of the active layer; forming a gate layer in the display unit region and on a surface, away from the substrate, of the gate insulating film; forming a first interlayer dielectric film on a surface, away from the substrate, of the gate layer; and patterning the gate insulating film and the first interlayer dielectric film, so as to retain a portion of the gate insulating film located in the display unit region to obtain a gate insulating layer, and to retain a portion of the first interlayer dielectric film located in the display unit region to obtain a first interlayer dielectric layer. Forming the first organic film includes: forming the first organic film in the gap region between the every two adjacent display unit regions through a coating process; causing at least a portion of a surface, away from the substrate, of the first organic film to form a flat region, the flat region being level with a surface, away from the base, of the first interlayer dielectric layer compared with the substrate, or the flat region being lower than a surface, away from the base, of the first interlayer dielectric layer compared with the substrate, or the flat region being higher than a surface, away from the base, of the first interlayer dielectric layer compared with the substrate.

In some embodiments, forming the conductive layer includes: forming a conductive film on the surface, away from the substrate, of the first organic film and on the surface, away from the substrate, of the first interlayer dielectric layer; and patterning the conductive film to form the conductive layer located in the connection unit region and a source-drain electrode layer located in the display unit region, the source-drain electrode layer including a source and a drain.

In some embodiments, before the active layer is formed, the method further includes: forming a barrier film and a buffer film sequentially on the substrate in a stacked manner; and when the gate insulating film and the first interlayer dielectric film are patterned, patterning the barrier film and the buffer film simultaneously, so as to retain a portion of the barrier film located in the display unit region to obtain a barrier layer, and to retain a portion of the buffer film located in the display unit region to obtain a buffer layer; and/or before the first interlayer dielectric film is formed, the method further includes: forming a second interlayer dielectric film on a surface, away from the substrate, of the gate layer; forming a capacitor electrode layer in the display unit region and on a surface, away from the substrate, of the second interlayer dielectric film; and when the gate insulating film and the first interlayer dielectric film are patterned, patterning the second interlayer dielectric film simultaneously, so as to retain a portion of the second interlayer dielectric film located in the display unit region to obtain a second interlayer dielectric layer.

In some embodiments, before the first organic film and the second organic film are patterned, the method further includes: forming an electroluminescent device in each display unit region and on a side of the substrate; and forming an inorganic film on a side, away from the substrate, of the second organic film and the electroluminescent device. The method further includes: patterning the inorganic film to remove a portion located in the gap region and retain a portion located in the display unit region to obtain a second inorganic layer; or thinning a portion of the inorganic film located in the gap region; and patterning the thinned inorganic film, so as to retain a portion located in the connection unit region to obtain a first inorganic layer, and to retain a portion located in the display unit region to obtain a second inorganic layer, a thickness of the first inorganic layer being less than a thickness of the second inorganic layer.

In some embodiments, after the first organic layer and the second organic layer are formed, the method further includes: forming an electroluminescent device in each display unit region and on a side of the substrate; and forming an inorganic film on a side, away from the substrate, of the second organic layer and the electroluminescent device. The method further includes: patterning the inorganic film, so as to retain a portion located in the display unit region to obtain a second inorganic layer; or thinning a portion of the inorganic film located in the connection unit region; and patterning the thinned inorganic film, so as to retain a portion located in the connection unit region to obtain a first inorganic layer, and to retain a portion located in the display unit region to obtain the second inorganic layer, a thickness of the first inorganic layer being less than a thickness of the second inorganic layer.

In some embodiments, the method further includes: providing a base; separating the substrate from layers formed thereon; and transferring the layers to the base to form the display panel.

In yet another aspect, a display device is provided. The display device includes the display panel according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate. By reading a detailed description of non-limiting embodiments with reference to the following drawings, other features, purposes and advantages of the present disclosure will become apparent.

DETAILED DESCRIPTION

Figure 1:
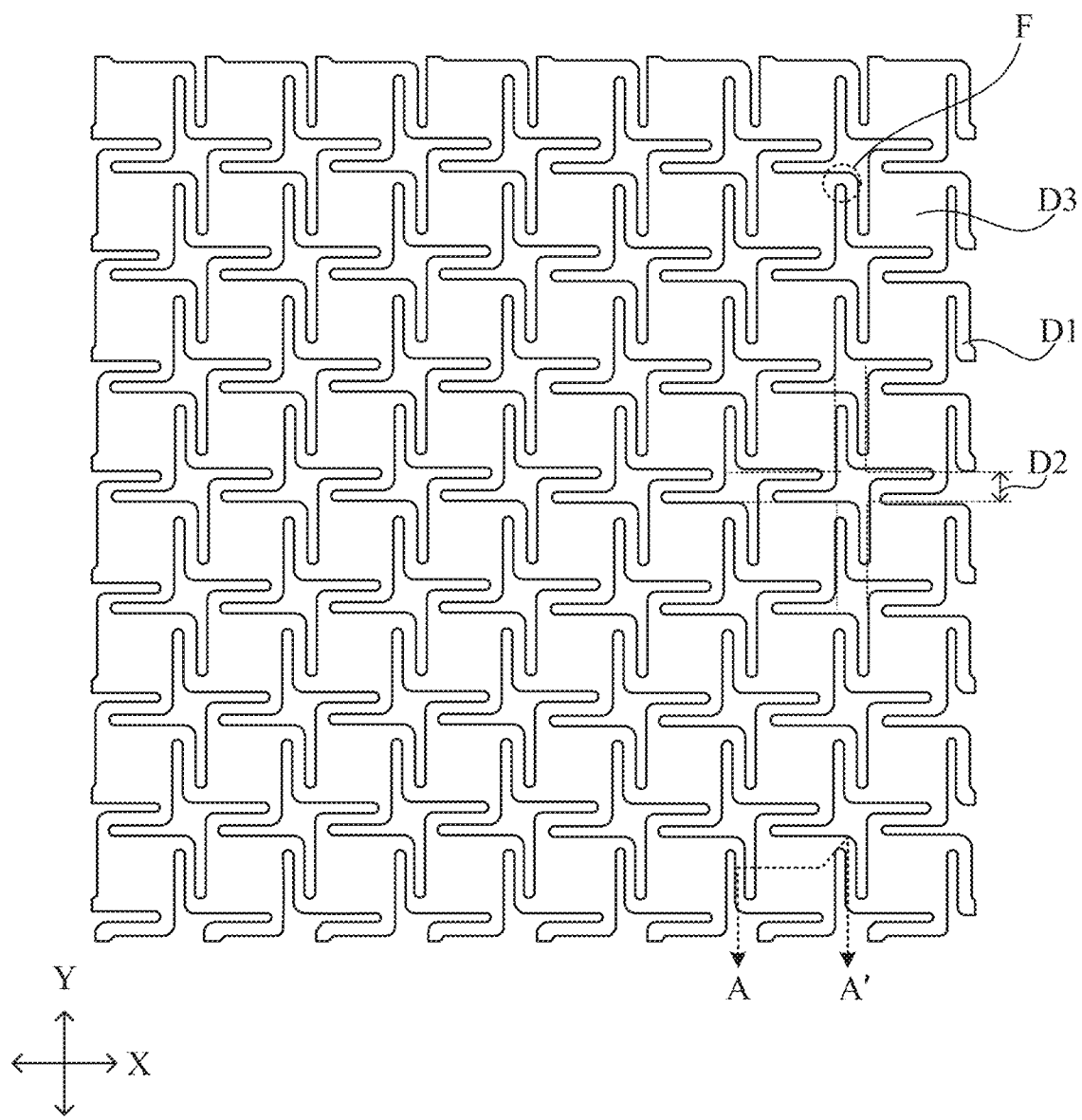
FIG. 1 is a schematic diagram showing a structure of a display panel, in accordance with embodiments of the present disclosure.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. As used in this specification and the appended claims, the singular forms "a/an" and "the" may also include plural referents unless the content clearly dictates otherwise. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as when or "in a case where" or "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation of a particular value. The acceptable range of deviation is determined by a person of ordinary skill in the art in view of the measurement in question and the errors associated with the measurement of the particular quantity (i.e., the limitations of the measurement system). For example, the term "parallel" includes absolute parallelism and approximate parallelism, and an acceptable range of deviation of the approximate parallelism may be, for example, a deviation within 5 degrees; the term "perpendicular" includes absolute perpendicularity and approximate perpendicularity, and an acceptable range of deviation of the approximate perpendicularity may also be, for example, a deviation within 5 degrees; the term "equal" includes absolute equality and approximate equality, and an acceptable range of deviation of the approximate equality may be, for example, a difference between two equals of less than or equal to 5% of either of the two equals.

Exemplary embodiments are described herein with reference to sectional views and/or plan views as idealized exemplary drawings. In the accompanying drawings, thicknesses of layers and regions are enlarged for clarity. Thus, variations in shapes relative to the accompanying drawings due to, for example, manufacturing technologies and/or tolerances may be envisaged. Therefore, the exemplary embodiments should not be construed to be limited to the shapes of the regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

It will be noted that, the embodiments in the present disclosure and features in the embodiments may be combined with each other in a case of no conflict, Hereinafter, the present disclosure will be described in detail with reference to the accompanying drawings and in combination with the embodiments.

FIG. 1 is a schematic diagram showing a structure of a display panel, in accordance with embodiments of the present disclosure. FIGS. 2 to 6 are sectional views of the display panel shown in FIG. 1.

As shown in FIGS. 1 and 2 to 6, some embodiments of the present disclosure provide a display panel 100, which includes a base 11, a plurality of display units D3 and a plurality of connection units D1.

For example, the display panel 100 is deformable. For example, the display panel may be bent, folded or stretched.

For convenience of description, the embodiments of the present disclosure are described by considering tensile deformation of the display panel 100 as an example.

For example, the base 11 may be a flexible base.

For example, the base 11 may be a base formed by a single film, or a base formed by stacking a plurality of films.

In a case where the base 11 is formed by a single film, the single film may be made of a material with a high elasticity such as dimethylsiloxane, polyimide (PI), or polyethylene terephthalate (PET).

In a case where the base 11 is formed by stacking two films, one of the films may be made of a material with a high elasticity such as dimethylsiloxane, PI or PET, and the other film may be made of a polymethyl methacrylate adhesive material, a silicon-based adhesive material, or the like.

For example, the plurality of display units D3 are disposed on a surface of the base 11, and there is a gap D2 between every two adjacent display units D3.

Herein, the description that there is a gap D2 between every two adjacent display units D3 means that there is no direct contact between the every two adjacent display units D3, and the every two adjacent display units D3 are separated by the gap D2.

A connection unit D1 is disposed in the gap D2, and is connected to every two adjacent display units D3.

For example, one or more connection units D1 may be disposed in the gap D2 between every two adjacent display units D3; the one or more connection units D1 are each connected to the every two adjacent display units D3.

For example, as shown in FIG. 1, the plurality of display units D3 are arranged in a matrix, i.e., arranged in a row direction X and a column direction Y. A connection unit D1 is provided in the gap D2 of every two adjacent display units D3 in the row direction X, and similarly, a connection unit D1 is provided in the gap D2 of every two adjacent display units D3 in the column direction Y.

It can also be interpreted that, most of display units D3 are each connected with four connection units D1 except for display units D3 located at edges of a display area of the display panel 100 (e.g., display units D3 located at the first row, the last row, the first column, or the last column). For each connection unit D1, one end of the connection unit D1 may be connected to a display unit D3 adjacent thereto, and the other end may be connected to the other display unit D3 adjacent thereto.

In some embodiments, as shown in FIGS. 2 to 6, the display unit D3 includes: an active layer 21, a gate insulating layer 23, a gate layer 24 and a first interlayer dielectric layer that are sequentially stacked on the base 11.

It will be noted that in the description of the embodiments of the present disclosure, the "layer" located in each unit (e.g., the display unit D3 or the connection unit D1) is a block with a small area, which is not a structure of an entire layer with a size equivalent to the size of the display area of the display panel 100. The term "layer" in each unit corresponds to or may be understood as a pattern. Considering the gate insulating layer 23 in the display unit D3 as an example, the gate insulating layer 23 corresponds to or may be understood as a gate insulating pattern; similarly, the gate layer 24 corresponds to or may be understood as a gate pattern and the first interlayer dielectric layer 27 corresponds to or may be understood as a first interlayer dielectric pattern.

For example, The display panel 100 may be an OLED (organic light-emitting diode) panel or a QLED (quantum dot light-emitting diode) panel. Considering the OLED panel as an example, the display unit D3 may be a sub-pixel or pixel (i.e. including more than one sub-pixel) level unit for displaying an image in the OLED panel.

A plurality of transistors (usually at least two) for forming a pixel driving circuit are provided in each display unit D3, that is, in each display unit D3, the active layer 21 includes a plurality of active patterns 211 arranged at intervals, and the gate layer 24 includes a plurality of gates 241 arranged at intervals.

Accordingly, a portion of the gate insulating layer 23 fills gaps between the plurality of active patterns 211 of the active layer 21, and a portion of the first interlayer dielectric layer 27 fills gaps between the plurality of gates 241.

It will be noted that, for convenience of illustration, only respective structures of one transistor in the display unit D3 are illustrated in the sectional views of FIGS. 2 to 6, etc., and structures are not actually drawn for the remaining transistors in the display unit D3.

In some embodiments, as shown in FIGS. 2 to 6, the display unit D3 further includes a source-drain electrode layer 22 disposed on a surface, away from the base 11, of the first interlayer dielectric layer 27; the source-drain electrode layer 22 includes sources and drains.

It will be noted that, since a source and a drain of a transistor may be structurally symmetrical, there may be no difference between the source and the drain of the same transistor in terms of structure. That is, in some examples, a structure is described as being electrically connected to the source, while in some other examples, this structure may be electrically connected to the drain and vice versa.

From the above description, a plurality of transistors are provided in each display unit D3, and accordingly the source-drain electrode layer 22 includes a plurality of sources and a plurality of drains.

For example, as shown in FIGS. 2 to 6, in the display unit D3, a source 22s, a drain 22d, an active pattern 211 and a gate 241 form a transistor 2.

In some examples, as shown in FIGS. 2 to 6, the display unit D3 further includes a barrier layer 12 and a buffer layer 13 that are disposed between the base 11 and the active layer 21 and are sequentially stacked.

For example, the barrier layer 12 and the buffer layer 13 may each be made of an insulating material.

In some examples, as shown in FIGS. 2 to 6, the display unit D3 further includes a second interlayer dielectric layer 26 and a capacitor electrode layer 25 that are disposed between the gate layer 24 and the first interlayer dielectric layer 27 and are sequentially stacked.

From the above description, the plurality of transistors are provided in each display unit D3, and accordingly a portion of the second interlayer dielectric layer 26 fills the gaps between the plurality of gates 241 of the gate layer 24.

The capacitor electrode layer 25 may include a plurality of capacitor electrodes 251 arranged at intervals. As shown in FIGS. 2 to 6, in the display unit D3, the gate electrode 241 is directly opposite to the capacitor electrode 251, that is, orthographic projections of the two on the base 11 overlaps. In this way, the gate electrode 241, the capacitor electrode 251 and a portion of the second interlayer dielectric layer 26 therebetween may form a storage capacitor, that is, the gate electrode 241 is the other capacitor electrode of the storage capacitor relative to the capacitor electrode 251.

In some embodiments, as shown in FIGS. 2 to 6, the display unit D3 further includes an electroluminescent device (e.g., OLED) 4 and a second inorganic layer 62 that are sequentially stacked.

For example, the electroluminescent device 4 may include, but is not limited to, an anode 43, a light-emitting layer 42, and a cathode 41.

For example, the electroluminescent device 4 may be connected to the pixel driving circuit. When driven by the pixel driving circuit, the electroluminescent device 4 emits light to achieve display of the display panel 100. For example, the anode 43 of the electroluminescent device 4 is electrically connected to the drain 22d of the transistor 2.

For example, the second inorganic layer 62 may be used to encapsulate the display unit D3, protect the display unit D3 from being corroded by external water and oxygen, and prolong a service life of the display unit D3.

Of course, the embodiments of the present disclosure do not limit the layers included in the display unit D3, and arrangements of the layers in the display unit D3 in the embodiments of the present disclosure are not limited to the above examples, and other layers may further be provided.

In an example, display units in a display panel are connected to each other to form an integrated structure directly, that is, a barrier layer, a buffer layer, a gate insulating layer, a second interlayer dielectric layer, a first interlayer dielectric layer, and a second inorganic layer in the display unit are each in a planar shape and with a size equivalent to a size of a display area of the display panel Since the barrier layer, the buffer layer, the gate insulating layer, the second interlayer dielectric layer, the first interlayer dielectric layer and other layers in the display panel are each in a planar shape and generally made of an inorganic material, during a bending process of the display panel, the bending region of the display panel is stretched, and a portion of the above layers in the bending region will be broken or irreversibly deformed, thereby affecting the deformability of the display panel.

Based on this, there is a need to release an amount of tensile strain on the display panel during the bending process. In order to simplify a process of manufacturing the display panel and reduce difficulty in manufacturing the display panel, a portion of the plurality of layers described above between every two adjacent display units are patterned, so that the plurality of layers are hollowed out, and stress generated during the stretching is released through voids in the plurality of layers, which is a method for manufacturing a deformable display panel. A portion between every two adjacent display units is a connection unit, which includes a portion of the plurality of layers. However, a part of the stress generated during the stretching is concentrated on the connection unit, which causes cracks of the plurality of layers (i.e., the barrier layer, the buffer layer, the gate insulating layer, the first interlayer dielectric layer, the second interlayer dielectric layer, and the like) first, and the cracks continuously expand with an increase of a stretching amount, which eventually causes breakage of lines in the connection unit and even the entire connection unit, and in turn causes a failure of the electroluminescent devices in the display units. In addition, since the connection unit mainly includes a portion of the plurality of layers, a stretch rate of the display panel is small.

Figure 2:
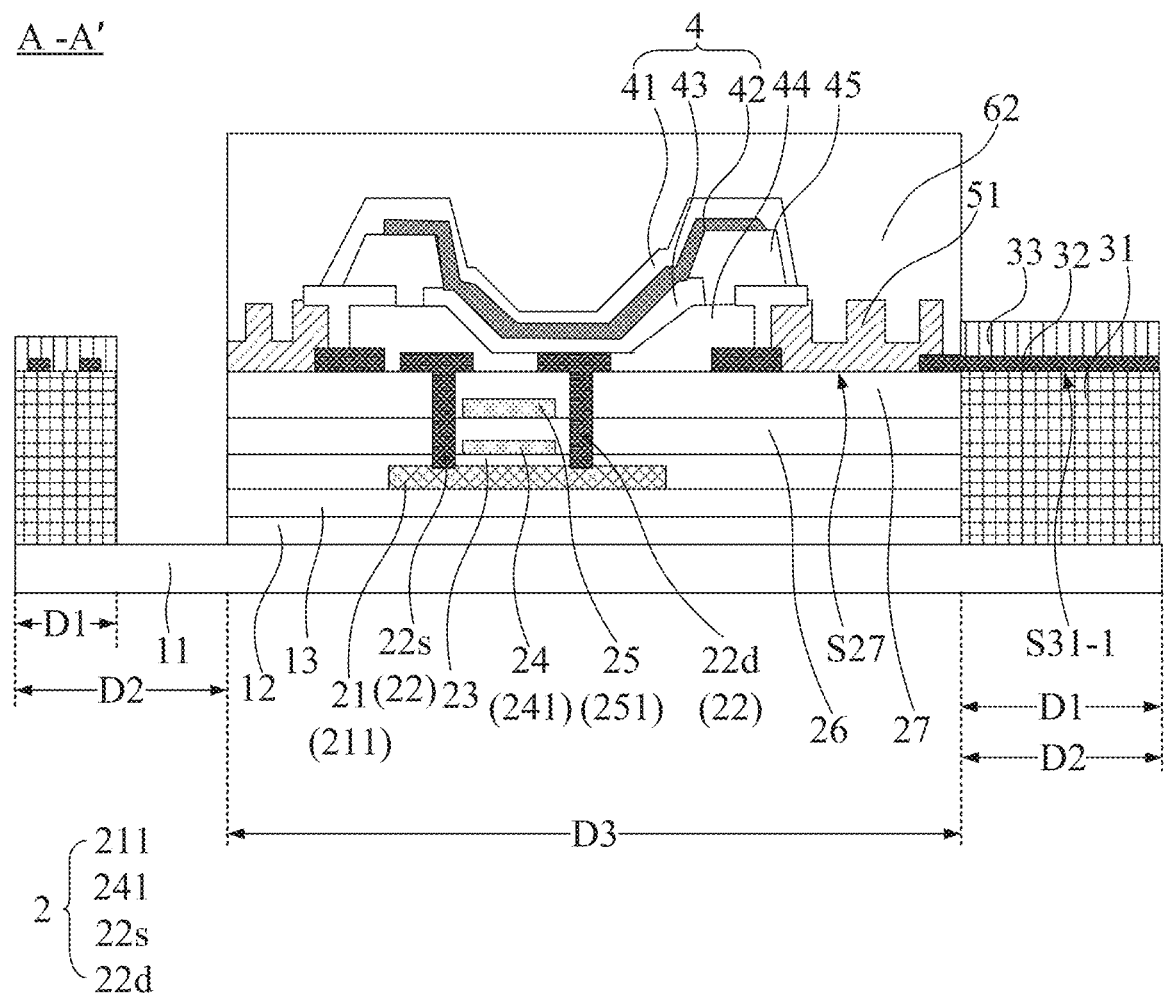
FIG. 2 is a sectional view of the display panel shown in FIG. 1 taken along the line A-A'.

Based on this, as shown in FIG. 2, in the display panel 100 provided by some embodiments of the present disclosure, the connection unit D1 includes a first organic layer 31, a conductive layer 32 and a second organic layer 33 that are sequentially stacked.

It will be noted that, for the description of the term of "layer" in each layer of the connection unit D1, reference is made to the foregoing description of the display unit D3, and details are not repeated here.

For example, the conductive layer 32 may include a portion of lines (such as data signal lines and scan signal lines) located in the gap D2, and the conductive layer 32 may be connected to a conductive structure of the display unit D3 for transmitting corresponding electrical signals to the electroluminescent device 4 and the pixel driving circuit in the display unit D3. For example, the conductive structure may be one or more of the gate layer 24, the capacitor electrode layer 25, or the source-drain electrode layer 22.

For example, the conductive layer 32 may transmit a data signal, a scan signal, a common voltage signal or the like to the display unit D3 to control the display.

For example, the first organic layer 31 and the second organic layer 33 may be made of the same material or different materials.

For example, the first organic layer 31 or the second organic layer 33 may be made of at least one of: a polymer of polymethyl methacrylate and polystyrene, a polymer and a derivative of phenol groups, a polymer of acryl, a polymer of para-xylene, a polymer of aryl ether, a polymer of amide, a polymer of fluoride, or a polymer of vinyl alcohol.

In some examples, the first organic layer 31 and the second organic layer 33 are each configured to block stress causing the connection unit D1 to deform, so as to prevent a crack from being generated in the connection unit D1.

A tensile strain that occurs when the display panel 100 is bent will be exemplarily described below with reference to FIGS. 1 and 2. In this case, the stress causing the connection unit D1 to deform is the tensile stress.

In a case where a small force is applied to the display panel 100 to bend the display panel 100 to a small degree, the display panel 100 may be subjected to a tensile strain. The tensile strain may be released at the gap D2 between every two adjacent display units D3 of the display panel, so that a probability of concentration of the stress may be reduced, and in turn, irreversible deformation of the display panel 100 may be avoided, and damage to the display panel 100 may be avoided.

In a case where a large force is applied to the display panel 100 to bend the display panel 100 to a large degree, the gap D2 between every two adjacent display units D3 of the display panel 100 may release a part of the tensile stress, and unreleased tensile stress is concentrated on the second organic layer 32 and/or the first organic layer 31 of the connection unit D1 of the display panel 100, especially a connection position F (represented by the dotted circle in FIG. 1) between the connection unit D1 and the display unit D3: The first organic layer 31 and the second organic layer 33 are each made of an organic material, and the second organic layer 33 and/or the first organic layer 31 may absorb the concentrated tensile stress, and then are elastically deformed to block transfer of the tensile stress. Therefore, arrangement of the first organic layer 31 and/or the second organic layer 33 may effectively prevent the cracks from occurring, thereby ensuring that the connection unit D1 has a good structural stability, and avoiding fracture of the conductive layer 32 in the connection unit D1.

Based on this, the tensile stress transferred by the first organic layer 31 and/or the second organic layer 33 to the conductive layer 32 may be very small or even zero, so that a large tensile strain or even fracture of the conductive layer 32 may be avoided, and a signal transmission function of the conductive layer 32 may be prevented from being affected due to the deformation or fracture thereof. Therefore, the first organic layer 31 and the second organic layer 33 may block influence of the stress of the connection unit D1 on the conductive layer 32, so that a large stretch rate of the display panel 100 may be achieved without affecting the function of the conductive layer 32.

In the display panel 100 provided by some embodiments of the present disclosure, by arranging the plurality of display units D3 at intervals, there is the gap D2 between every two adjacent display units D3, so that a part of the tensile stress may be released through the gap D2 between the every two adjacent display units D3 when the display panel 100 is bent.

Furthermore, in the embodiments of the present disclosure, by arranging the connection unit D1 in the gap D2 between the every two adjacent display units D3, and arranging the first organic layer 31, the conductive layer 32 and the second organic layer 33 that are sequentially stacked in the connection unit D1, the part of tensile stress unreleased by the gap D2 may be absorbed and blocked by using the first organic layer 31 and/or the second organic layer 33, so that the cracks caused by the concentration of the stress may be effectively avoided, and induced fracture caused by the cracks may be avoided. As a result, it may be possible to ensure that the connection unit D1 has a good structural stability, and to avoid the fracture of the conductive layer 32 in the connection unit D1.

For example, a thickness of the first organic layer 31 may be less than or equal to 3 µm: a thickness of the second organic layer 33 may be less than or equal to 3 µm. The two may have the same thickness or different thicknesses.

For example, the thickness of the first organic layer 31 may be 1 µm, 1.5 µm, 2 µm, 2.5 µm, or 3 µm.

For example, the thickness of the second organic layer 33 may be 1 µm, 1.5 µm, 2 µm, 2.5 µm, or 3 µm.

By setting the thickness of the first organic layer 31 and the thickness of the second organic layer 33 within the above range, the stress causing the connection unit D1 to deform may be effectively blocked, the deformation or even fracture of the conductive layer 32 may be avoided, and the stretch rate of the display panel 100 may be improved.

In some embodiments, as shown in FIGS. 2 to 6, a surface S31, away from the base 11, of the first organic layer 31 in the connection unit D1 includes a flat region S31-1. For convenience of description, the surface S31, away from the base 11, of the first organic layer 31 is referred to as an upper surface 331 hereinafter.

The flat region S31-1 refers to a portion of the upper surface S31 of the first organic layer 31 where various positions are all at a same distance from the base 11.

Figure 3:
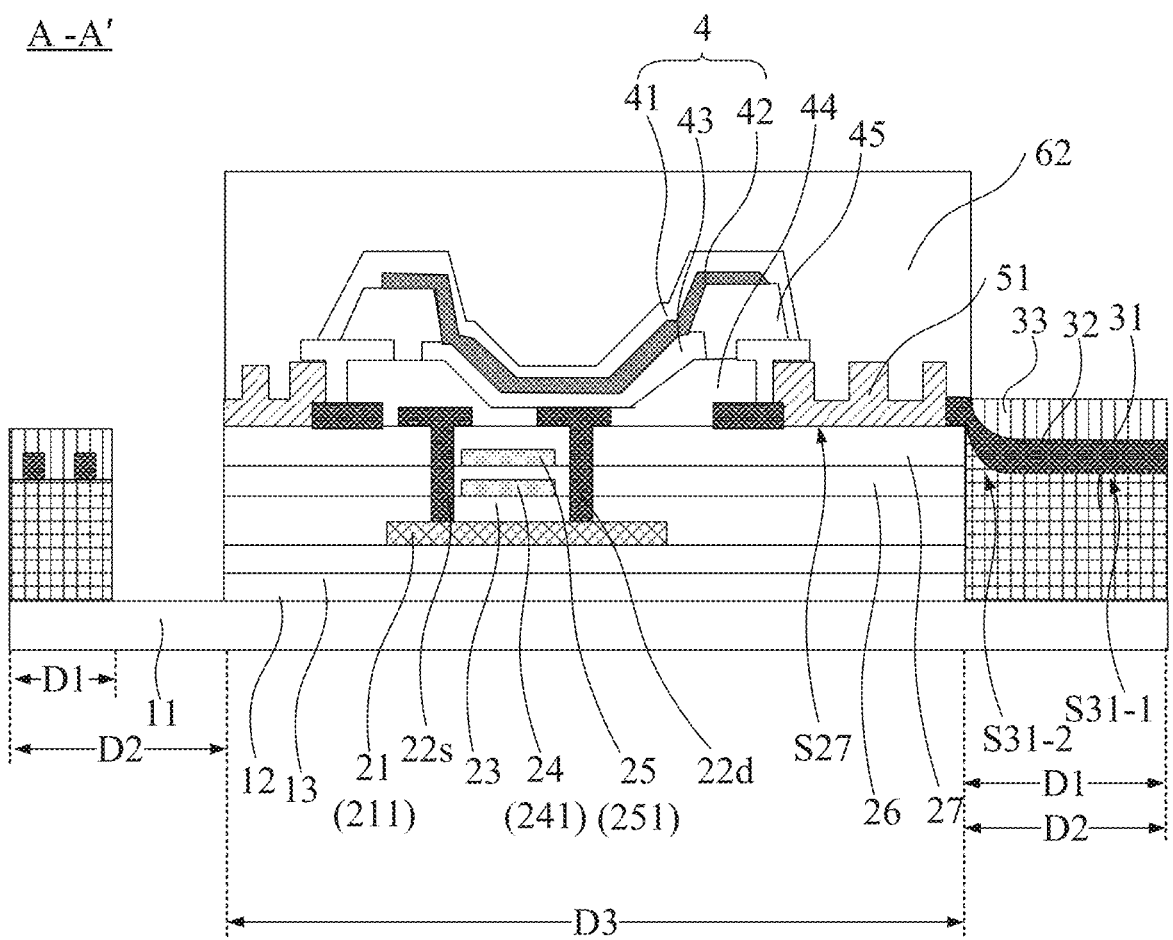
FIG. 3 is another sectional view of the display panel shown in FIG. 1 taken along the line A-A'.
Figure 4:
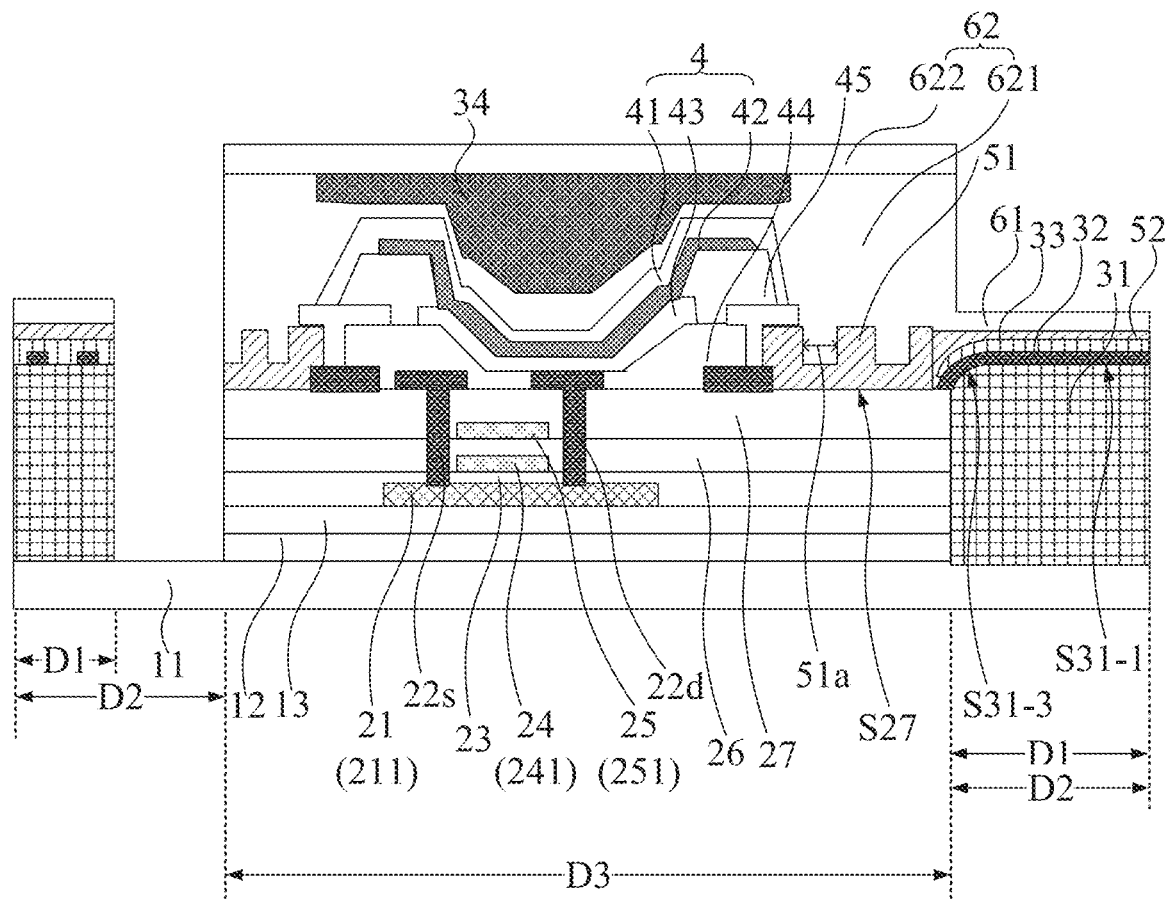
FIG. 4 is yet another sectional view of the display panel shown in FIG. 1 taken along the line A-A'.
Figure 5:
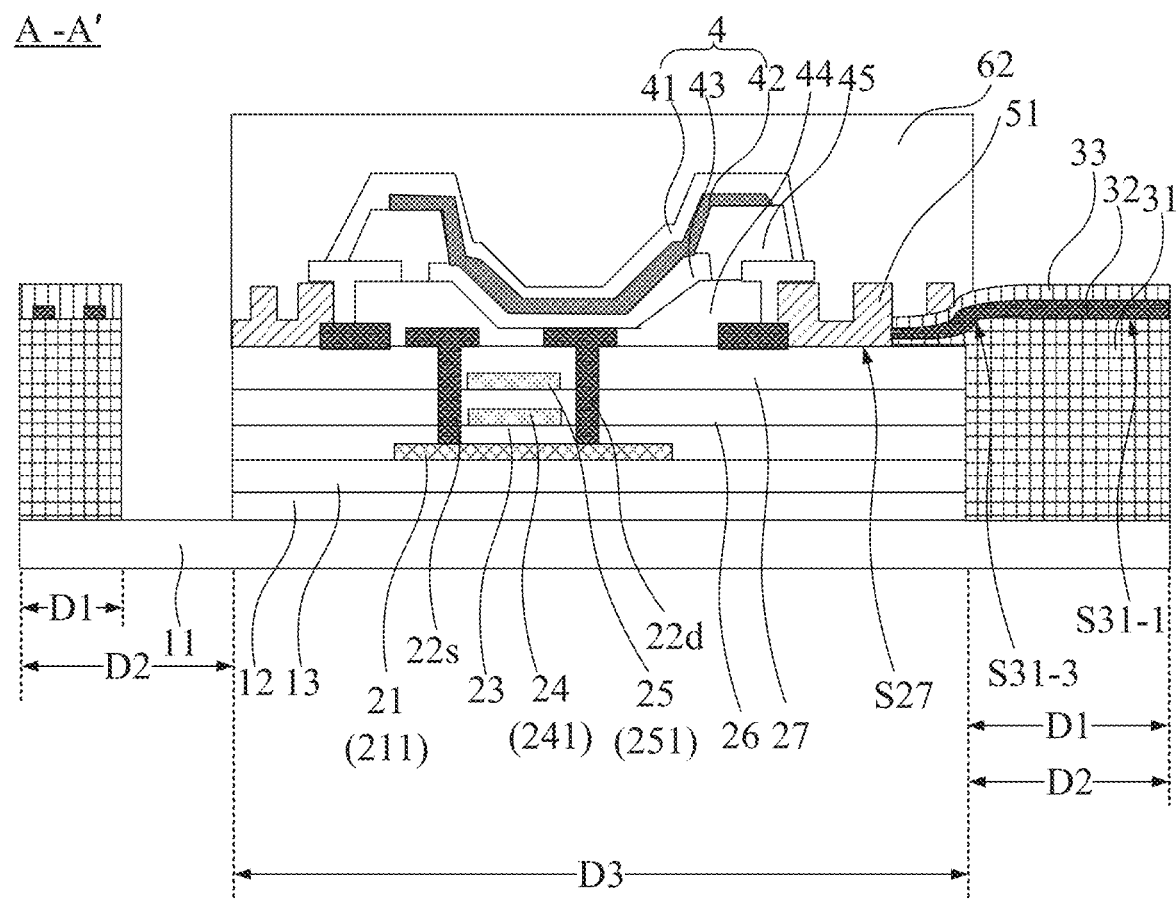
FIG. 5 is yet another sectional view of the display panel shown in FIG. 1 taken along the line A-A'.
Figure 6:
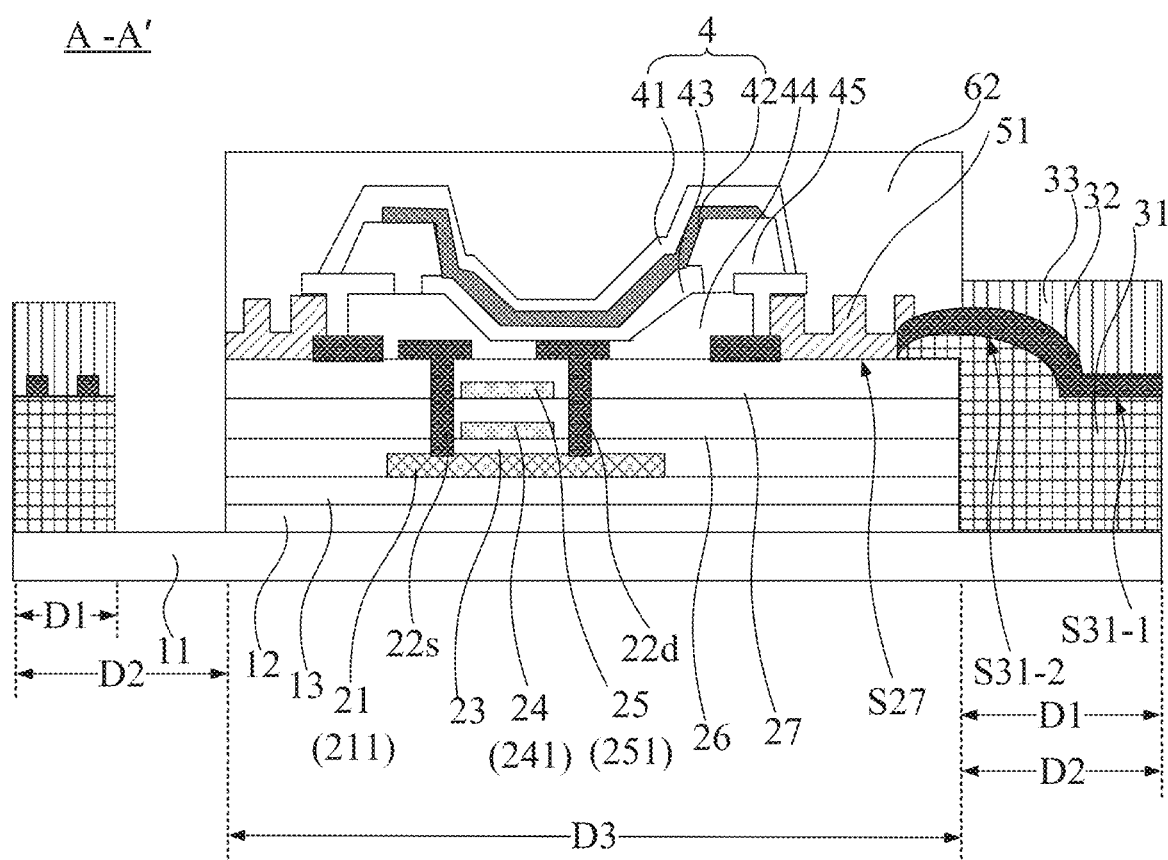
FIG. 6 is yet another sectional view of the display panel shown in FIG. 1 taken along the line A-A'.

For convenience of description, a surface S27, away from the base 11, of the first interlayer dielectric layer 27 is referred to as an upper surface S27 hereinafter. For example, as shown in FIG. 2, the flat region S31-1 is level with the upper surface S27 of the first interlayer dielectric layer 27 compared with the base 11. Or as shown in FIGS. 3 and 6, the flat region S31-1 is lower than the upper surface S27 of the first interlayer dielectric layer 27 compared with the base 11. Or as shown in FIGS. 4 and 5, the flat region S31-1 is higher than the upper surface S27 of the first interlayer dielectric layer 27 compared with the base 11.

That is to say, the distance between the flat region S31-1 of the upper surface S31 of the first organic layer 31 of the connection unit D1 and the base 11 is equal or unequal to a distance between the upper surface S27 of the first interlayer dielectric layer 27 in the display unit D3 and the base 11.

In some embodiments, the flat region S31-1 is level with the upper surface S27 of the first interlayer dielectric layer 27 compared with the base 11, there may be no large step difference between the flat region S31-1 and the upper surface S27 of the first interlayer dielectric layer 27, and they are close to a flat surface as a whole. As a result, a connection position between the conductive layer 32 on the flat region S31-1 of the first organic layer 31 and the conductive structure on the first interlayer dielectric layer 27 in the display unit D3 may be approximately flat, and there is no large step difference, and a risk of fracture at the connection position between the conductive layer 32 and the display unit D3 may be effectively reduced.

In some other embodiments, as shown in FIG. 3, the flat region S31-1 is lower than the upper surface S27 of the first interlayer dielectric layer 27 compared with the base 11, and accordingly the upper surface S31 of the first organic layer 31 further includes first transition regions S31-2 located at two opposite sides of the flat region S31-1. One end of each first transition region S31-2 is connected to the flat region S31-1, and the other end of the first transition region S31-2 gently rises to a height level with an upper surface S27 of a first interlayer dielectric layer 27 of a display unit D3 connected to the first transition region S31-2, in a direction close to the display unit D3, and is in contact with the upper surface S27 of the first interlayer dielectric layer 27.

It will be noted that, each connection unit D1 is connected to two adjacent display units D3. Usually, the two display units D3 are respectively located at both ends of the connection unit D1 in an extending direction thereof. In the respective sectional views, only the display unit D3 located at one end of the connection unit D1 is shown, and a description of the display unit D3 located at the other end is not repeated. Moreover, the gentle rise means that the other end of the first transition region S31-2 rises at a certain slope, which is small, in the direction close to the display unit D3.

For example, the first transition region S31-2 is a smooth transition region. As shown in FIG. 3, in a thickness direction of the display panel 100, a section of the first transition region S31-2 is arc-shaped rather than broken-line-shaped. In this way, the conductive layer 32 on the first organic layer 31 may gently rise to the height level with the first interlayer dielectric layer 27 along the first transition region S31-2, so that the fracture at the connection position between the conductive layer 32 and the conductive structure of the display unit D3 caused by the step difference may be effectively avoided.

In yet some other embodiments, as shown in FIG. 6, the flat region 331-1 is lower than the upper surface 327 of the first interlayer dielectric layer 27 compared with the base 11, and accordingly the upper surface 331 of the first organic layer 31 further includes first transition regions S31-2 located at two opposite sides of the flat region 331-1. One end of each first transition region S31-2 is connected to the flat region 331-1, and the other end of the first transition region 331-2 gently rises to a height greater than that of an upper surface 327 of a first interlayer dielectric layer 27 of a display unit D3 connected to the first transition region 331-2, in a direction close to the display unit D3, and overlaps an edge of the upper surface S27 of the first interlayer dielectric layer 27.

It will be noted that, the description that the other end of the first transition region 331-2 gently rises to a height greater than that of the upper surface 327 of the first interlayer dielectric layer 27, and overlaps the edge of of the upper surface S27 of the first interlayer dielectric layer 27 means that the other end of the first transition region S31-2 rises at a certain slope, which is small, in the direction close to the display unit D3; after rising to the height greater than that of the upper surface 327 of the first interlayer dielectric layer 27, the other end of the first transition region 331-2 descends to the edge of the upper surface S27 of the first interlayer dielectric layer 27 at a certain slope, which is small.

For example, the first transition region 331-2 is a smooth transition region. As shown in FIG. 6, in a thickness direction of the display panel 100, the section of the first transition region S31-2 is approximately arc-shaped rather than broken-line-shaped. In this way, the conductive layer 32 on the first organic layer 31 may gently rise to the height greater than that of the first interlayer dielectric layer 27 along the first transition region S31-2, and then gently descend to the edge of the upper surface 327 of the first interlayer dielectric layer 27. As a result, the fracture at the connection position between the conductive layer 32 and the conductive structure of the display unit D3 caused by the step difference may be effectively avoided.

In these examples, in a case where the first transition region 331-2 overlaps the edge of the upper surface 327 of the first interlayer dielectric layer 27, an overlapping length of the first transition region S31-2 may be, for example, less than or equal to 5 µm in a direction from the first transition region 331-2 to the display unit D3 connected thereto. For example, the overlapping length of the first transition region 331-2 may be 1 µm, 2 µm, 3 µm, 4 µm, or 5 µm.

By setting the overlapping length of the first transition region 331-2 within the above range, a surface where the connection position between the conductive layer 32 on the first organic layer 31 and the conductive structure on the first interlayer dielectric layer 27 is located may be made flat, and the risk of fracture caused by the step difference between the first organic layer 31 and the first interlayer dielectric layer 27 may be effectively reduced.

In a case where a thickness of the connection unit D1 is constant, compared with the base 11, the flat region 331-1 of the upper surface 331 of the first organic layer 31 of the connection unit D1 is lower than the upper surface 327 of the first interlayer dielectric layer 27 of the display unit D3. In this case, a thickness of the second organic layer 33 may be appropriately increased, and the thick second organic layer 33 is able to block a large tensile stress, so that a large stretch rate of the display panel 100 may be achieved, and the conductive layer 32 may be well protected.

In yet some other embodiments, as shown in FIG. 4, the flat region S31-1 is higher than the upper surface 327 of the first interlayer dielectric layer 27 compared with the base 11, and accordingly the upper surface 331 of the first organic layer 31 further includes second transition regions 331-3 located at two opposite sides of the flat region S31-1. One end of each second transition region 331-3 is connected to the flat region S31-1, and the other end of the second transition region S31-3 gently descends to a height level with an upper surface 327 of a first interlayer dielectric layer 27 of a display unit D3 connected to the second transition region S31-3, in a direction close to the display unit D3, and is in contact with the upper surface S27 of the first interlayer dielectric layer 27.

It will be noted that, the gentle descent means that the other end of the second transition region S31-3 descends at a certain slope, which is small, in the direction close to the display unit D3.

For example, the second transition region 331-3 is a smooth transition region. As shown in FIG. 4, in a thickness direction of the display panel 100, a section of the second transition region 331-3 is arc-shaped rather than broken-line-shaped. In this way, the conductive layer 32 on the first organic layer 31 may gently descend to the height level with the first interlayer dielectric layer 27 along the second transition region 331-3, so that the fracture at the connection position between the conductive layer 32 and the conductive structure of the display unit D3 caused by the step difference may be effectively avoided.

In yet some other embodiments, as shown in FIG. 5, the flat region 331-1 is higher than the upper surface 327 of the first interlayer dielectric layer 27 compared with the base 11, and accordingly the upper surface S31 of the first organic layer 31 further includes second transition regions 331-3 located at two opposite sides of the flat region 331-1. One end of each second transition region 331-3 is connected to the flat region 331-1, and the other end of the second transition region 331-3 gently descends to a height greater than that of an upper surface 327 of a first interlayer dielectric layer 27 of a display unit D3 connected to the second transition region S31-3, in a direction close to the display unit D3, and overlaps an edge of the upper surface S27 of the first interlayer dielectric layer 27.

It will be noted that, the description that the other end of the second transition region S31-3 gently descends to a height greater than that of the upper surface S27 of the first interlayer dielectric layer 27, and overlaps the edge of the upper surface S27 of the first interlayer dielectric layer 27 means that the other end of the second transition region S31-3 descends at a certain slope, which is small, in the direction close to the display unit D3; after descending to the height greater than that of the upper surface S27 of the first interlayer dielectric layer 27, the other end of the second transition region S31-3 continues to descend towards the upper surface S27 of the first interlayer dielectric layer 27 at a certain slope, which is small, and descends to the edge of the upper surface S27 of the first interlayer dielectric layer 27.

For example, as shown in FIG. 5, the second transition region S31-3 is a smooth transition region rather than broken-line-shaped. In this way, the conductive layer 32 on the first organic layer 31 may gently descend to the height greater than that of the first interlayer dielectric layer 27 along the second transition region S31-3, and then gently descend to the edge of the upper surface S27 of the first interlayer dielectric layer 27. As a result, the fracture at the connection position between the conductive layer 32 and the conductive structure of the display unit D3 caused by the step difference may be effectively avoided.

For example, in a case where the second transition region S31-3 overlaps the edge of the upper surface S27 of the first interlayer dielectric layer 27, an overlapping length of the second transition region S31-3 may be less than or equal to 5 μm. For example, the overlapping length of the second transition region S31-3 may be 1 μm, 2 μm, 3 μm, 4 μm, or 5 μm.

An area of the first transition region S31-2 or the second transition region S31-3 covering the upper surface S27 of the first interlayer dielectric layer 27 may be set as required, and is not limited herein.

Figure 18:
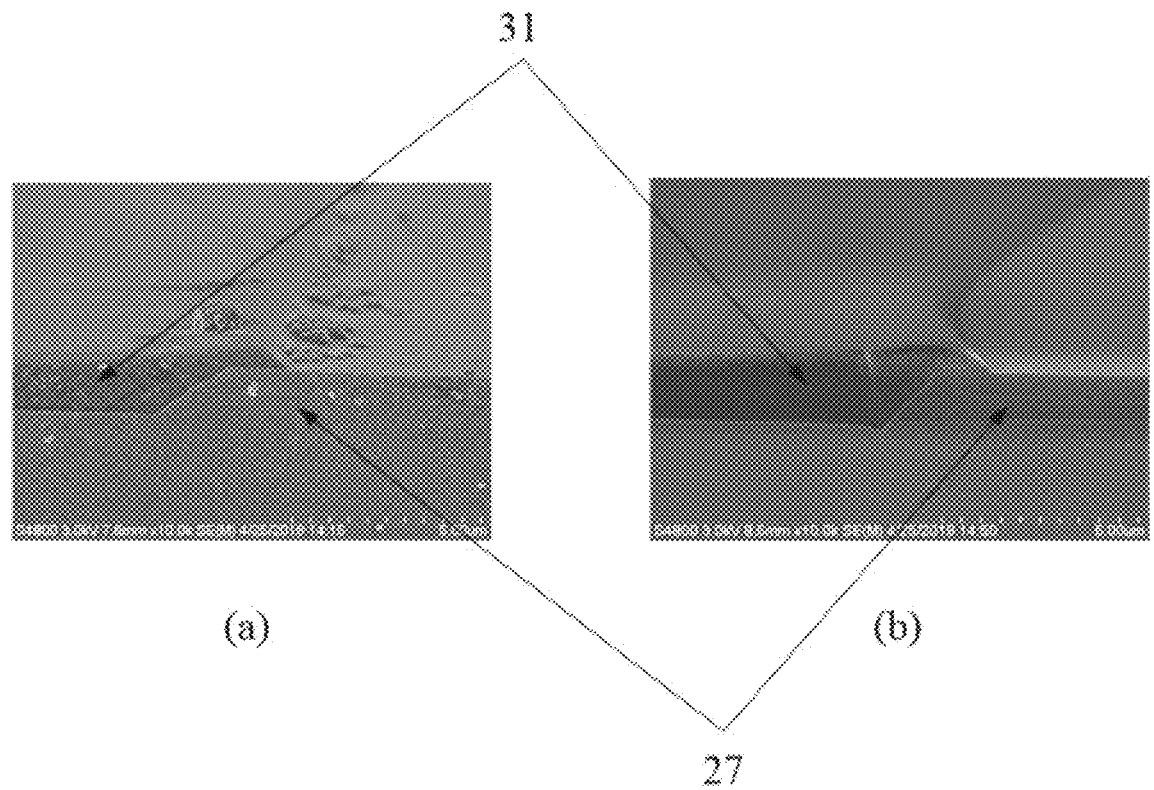
FIG. 18 shows scanning electron microscope (SEM) photographs of a connection unit of a display panel, in accordance with embodiments of the present disclosure.

The (a) and (b) in the FIG. 18 each show a case where the first organic layer 31 described above overlaps the edge of the upper surface S27 of the first interlayer dielectric layer 27. It can be seen that, arrangement of an edge of the upper surface S31 of the first organic layer 31 (i.e., the first transition region S31-2 or the second transition region S31-3) reduces the step difference between the first organic layer 31 and the first interlayer dielectric layer 27, and reduces the risk of fracture at the connection position between the conductive layer 32 on the first organic layer 31 and the connection unit D1.

In some examples, the conductive layer 32 of the connection unit D1 and the conductive structure of the display unit D3 may be disposed in a same layer.

For example, the conductive layer of the connection unit D1 and the source-drain electrode layer in the conductive structure may be disposed in the same layer.

It will be noted that, that A and B are disposed in a same layer means that A and B are formed by a process as follows: a film is formed first by using a same film-forming process and then a patterning process is performed on the film by using a same mask to form a layer structure with specific patterns including A and B. Depending on different specific patterns, the patterning process may include multiple exposure, development or etching processes, and the specific patterns may be continuous or discontinuous, and these specific patterns may also be at different heights or have different thicknesses. In this way, the conductive layer and the source-drain electrode layer may be formed simultaneously, which facilitates to simplify a manufacturing process of the display panel.

In some examples, as shown in FIG. 4, the connection unit D1 further includes a first inorganic layer 61 disposed on a surface, away from the base 11, of the second organic layer 33.

For example, as shown in FIG. 4, a thickness of the first inorganic layer 61 in the connection unit D1 is less than a thickness of the second inorganic layer 62 in the display unit D3.

For example, the first inorganic layer 61 may cover the second organic layer 33.

Herein, the first inorganic layer 61 may be used to protect the connection unit D1 from being corroded by external water and oxygen.

For example, a difference between the thickness of the first inorganic layer 61 and the thickness of the second inorganic layer 62 may be less than or equal to 2 μm. For example, the difference between the thickness of the first inorganic layer 61 and the thickness of the second inorganic layer 62 may be 0.5 μm, 1 μm, 1.5 μm, 1.7 μm, or 2 μm.

When the display panel 100 is bent, the gap D2 between two adjacent display units D3 of the display panel 100 releases a part of the tensile stress, and the unreleased tensile stress is concentrated on the connection unit D1 of the display panel. Since the thickness of the first inorganic layer 61 in the connection unit D1 in the embodiments the present disclosure is small than that of the second inorganic layer 62 of the display unit D3, influence of the concentrated stress on the first inorganic layer 61 may be reduced, and fracture of the first inorganic layer 61 may be avoided, and in turn induced fracture may be avoided. As a result, it may be possible to prevent the concentrated stress from being transferred to the second organic layer 33 in contact with the first inorganic layer 61, to avoid a large tensile strain or cracks of the second organic layer 33, to effectively avoid the fracture of the conductive layer 32 in contact with the second organic layer 33, and to achieve a large stretch rate of the display panel 100.

Figure 19:
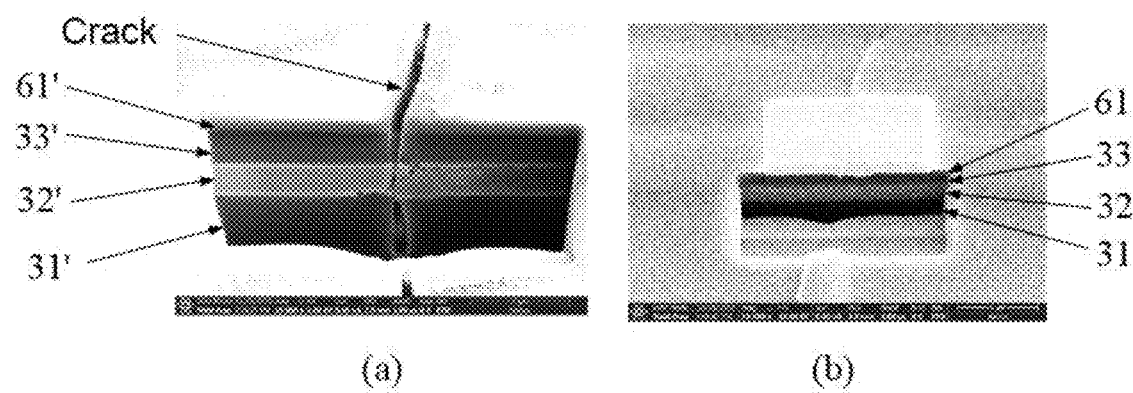
FIG. 19 shows an electron microscope photograph (as shown in (a)) of a connection unit of a display panel in an example, and an electron microscope photograph (as shown in (b)) of a connection unit of a display panel, in accordance with embodiments of the present disclosure, both of which are obtained through a focused ion beam (FIB) technology.

As shown in the (a) of FIG. 19, in an example, since a thickness of a first inorganic layer 61' in a connection unit is larger and is generally the same as that of a second inorganic layer in a display unit, when the display panel 100 is bent, the stress in the bending region is difficult to release, so that the first inorganic layer 61', the second organic layer 33', the conductive layer 32', and the first organic layer 31' in the connection unit are prone to be broken, so as to generate cracks, and a normal display of the display panel 100 is affected. In contrast, as shown the (b) of FIG. 19, in the display panel 100 provided in the embodiments of the present disclosure, since the thickness of the first inorganic layer 61 in the connection unit D1 is smaller, the extension of the stress is blocked, and the connection unit D1 is prevented from being broken, thereby being beneficial to ensuring the normal display of the display panel 100.

For example, the thickness of the first inorganic layer 61 may be less than or equal to 0.3 μm. For example, the thickness of the first inorganic layer 61 may be 0.1 μm, 0.15 μm, 0.2 μm, 0.25 μm, or 0.3 μm.

In a case where the thickness of the first inorganic layer 61 is less than 0.3 μm, when the display panel 100 is bent, since the first inorganic layer 61 is very thin, the tensile stress concentrated on the first inorganic layer 61 causes the first inorganic layer 61 to be separated from the second organic layer 33. As a result, it may be possible to prevent the first inorganic layer 61 from transferring the tensile stress to the second organic layer 33, to avoid a large tensile strain or the cracks of the second organic layer 33, to effectively avoid the fracture of the conductive layer 32 in contact with the second organic layer 33, and to achieve a large stretch rate of the display panel 100.

For example, the first organic layer 61 and the second organic layer 62 may be made of the same material. For example, the first inorganic layer 61 and the second inorganic layer 62 are each made of silicon oxide, silicon nitride, or silicon oxynitride.

In some examples, as shown in FIG. 4, the second inorganic layer 62 may include a first inorganic sub-layer 621 and a second inorganic sub-layer 622 that are sequentially stacked. The display unit 100 further includes a third organic layer 34 disposed between the first inorganic sub-layer 621 and the second inorganic sub-layer 622.

For example, the first inorganic sub-layer 621 may cover the electroluminescent device 4, the third organic layer 34 covers a portion of the first inorganic sub-layer 621, and the second inorganic sub-layer 622 covers the third organic layer 34 and the first inorganic sub-layer 621.

For example, an orthogonal projection of the third organic layer 34 on the base 11 is within a range of an orthogonal projection of the second inorganic sub-layer 622 on the base 11.

Arrangement of the third organic layer 34 may play a planarization role, so as to supply a flat surface for the second inorganic sub-layer 622 covering the third organic layer 34 to facilitate the preparation of the second inorganic sub-layer 622.

For example, the first inorganic layer 61 and at least a portion of the second inorganic layer 62 may be disposed in a same layer.

For example, in a case where the second inorganic layer 62 has a single-layer structure, the first inorganic layer 61 and the second inorganic layer 62 may be disposed in the same layer.

For another example, in a case where the second inorganic layer 62 has a double-layer structure, the first inorganic layer 61 and the first inorganic sub-layer 621 may be disposed in a same layer.

For yet another example, in the case where the second inorganic layer 62 has a double-layer structure, the first inorganic sub-layer 621 and a portion of the first inorganic layer 61 may be disposed in a same layer, and the second inorganic sub-layer 622 and the other portion of the first inorganic layer 61 may be disposed in a same layer.

In this way, the first inorganic layer 61 and the second inorganic layer 62 may be formed simultaneously, which facilitates to simplify the manufacturing process of the display panel 100.

In some embodiments, as shown in FIG. 4, the display unit D3 further includes a first protective layer 51 disposed between the electroluminescent device 4 and the base 11 and located beside the electroluminescent device 4.

For example, the first protective layer 51 may be located on one side of the electroluminescent device 4; or the first protective layer 51 may be located around the electroluminescent device 4.

For example, the second inorganic layer 62 may cover the first protective layer 51.

For example, a surface, away from the base 11, of the first protective layer 51 is provided with a plurality of grooves 51a.

Arrangement of the grooves 51a in the first protective layer 51 is used to increase a contact area between the first protective layer 51 and the second inorganic layer 62, increase a path for water and oxygen to enter the display unit D3 to corrode the electroluminescent device 4, and improve reliability of encapsulation, thereby improving a quality of the encapsulation, increasing a light-emitting lifetime of the electroluminescent device 4, and improving performance of the display panel 100.

In some embodiments, as shown in FIG. 4, the connection unit D1 further includes a second protective layer 52 disposed between the second organic layer 33 and the first inorganic layer 61.

For example, the second protective layer 52 covers the second organic layer 33.

The second protective layer 52 is used to protect the conductive layer 32 under the second protective layer 52 from being corroded by external water and oxygen.

In some examples, the second protective layer 52 and the first protective layer 51 may be disposed in a same layer.

In this way, the second protective layer 52 and the first protective layer 51 may be formed simultaneously in one patterning process, which facilitates to simplify the manufacturing process of the display panel 100.

For example, the first protective layer 51 and the second protective layer 52 may each be made of an inorganic material or an organic material.

For example, a thickness of the second protective layer 52 is less than a thickness of a portion of the first protective layer 51 that does not include the grooves 51a.

In a case where the second protective layer 52 is made of an inorganic material, the thickness of the second protective layer 52 is small, so that it may be possible to avoid that due to presence of the second protective layer 52, when the display panel 100 is bent, the tensile stress is concentrated on the second protective layer 52, and then transferred to the conductive layer 32 under the second organic layer 33, which causes the fracture of the conductive layer 32, thereby affecting the signal transmission function of the conductive layer 32.

In the case where the thickness of the connection unit D1 is constant, the thickness of the second protective layer 52 is small. In this case, the thickness of the second organic layer 33 may be set large to block a large tensile stress, so that a large stretch rate of the display panel 100 may be achieved, and the conductive layer 32 may be well protected.

For example, the thickness of the second protective layer 52 may be less than or equal to 2000 Å. For example, the thickness of the second protective layer 52 may be 500 Å, 1000 Å, 1500 Å, 1700 Å, or 2000 Å.

Figure 7:
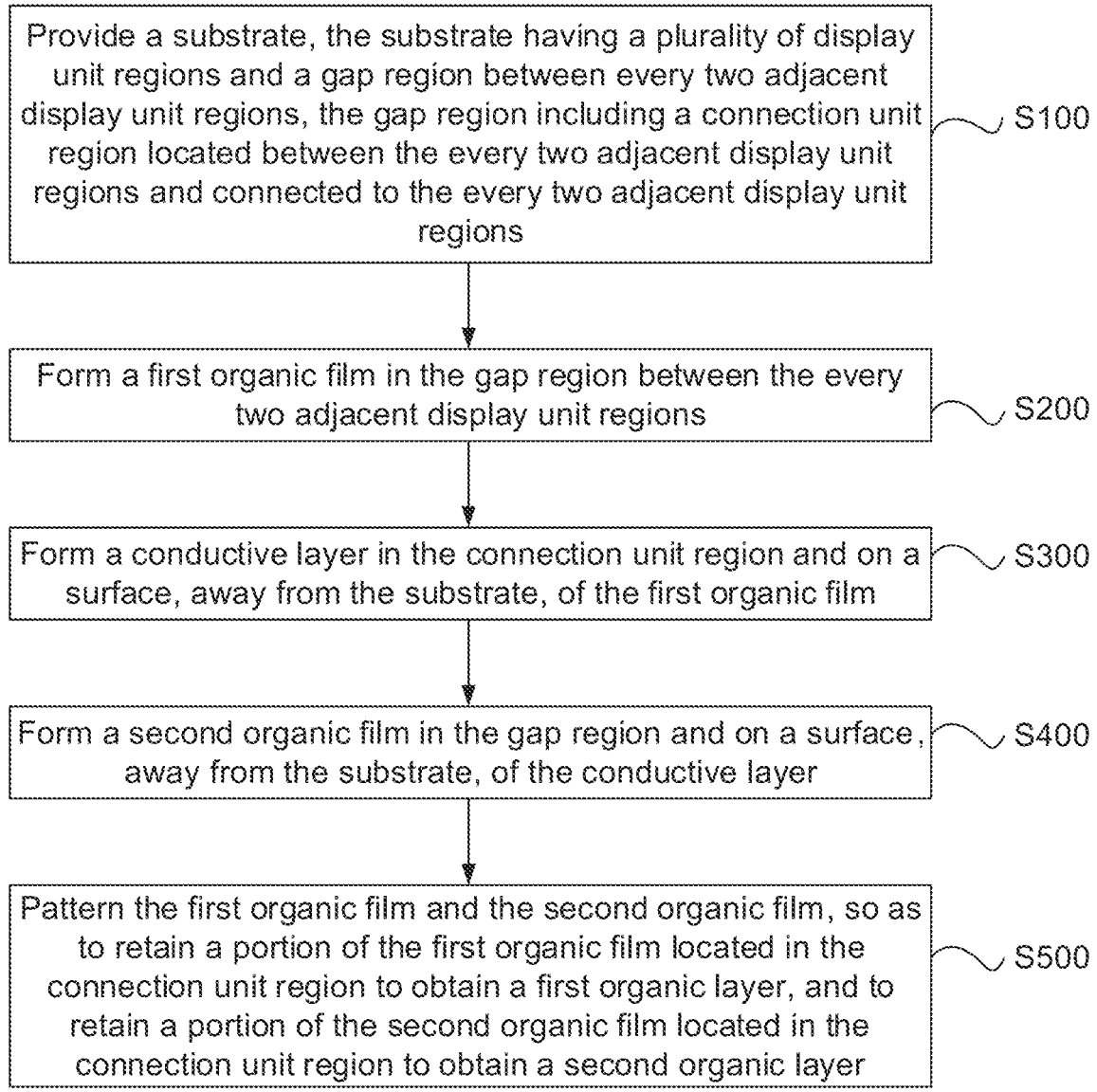
FIG. 7 is a flow diagram of a method for manufacturing a display panel, in accordance with embodiments of the present disclosure.

Some embodiments of the present disclosure provide a method for manufacturing a display panel 100. As shown in FIG. 7, the manufacturing method includes S100 to S500.

Figure 15A:
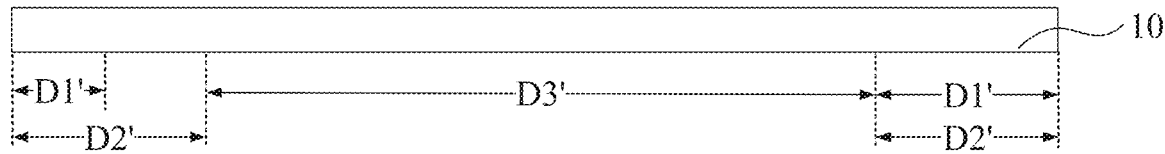
FIGS. 15A to 15Q are diagrams showing steps of a method for manufacturing a display panel, in accordance with embodiments of the present disclosure.

In S100, as shown in FIG. 15A, a substrate 10 is provided, the substrate 10 having a plurality of display unit regions D3' and a gap region D2' between every two adjacent display unit regions D3', the gap region D2' including a connection unit region D1' located between the every two adjacent display unit regions D3' and connected to the every two adjacent display unit regions D3'.

For example, the substrate 10 may be made of a rigid material, such as glass.

Figure 15B:
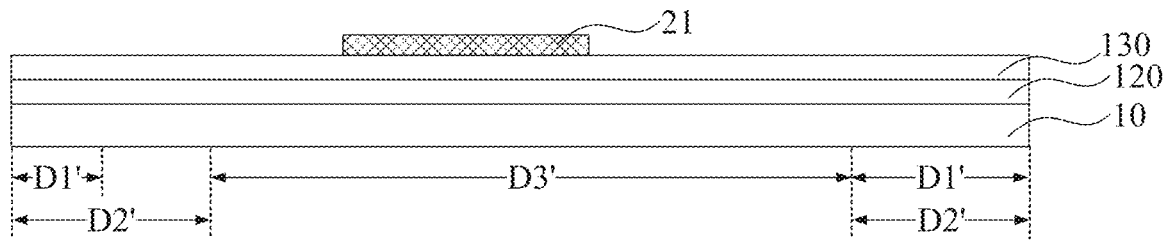
Figure 15C:
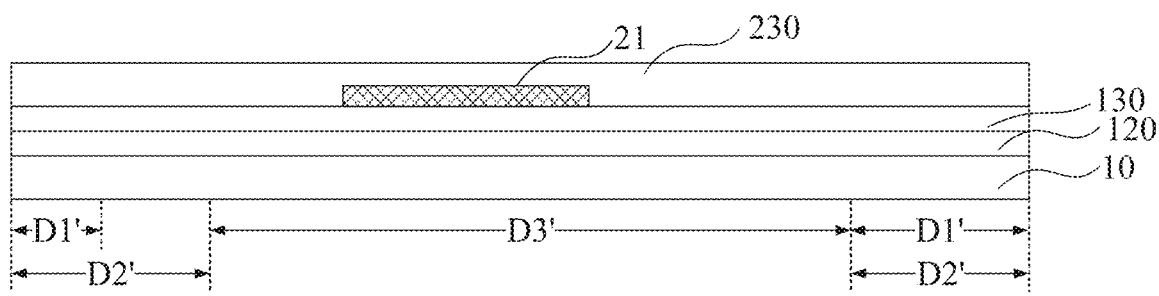
Figure 15D:
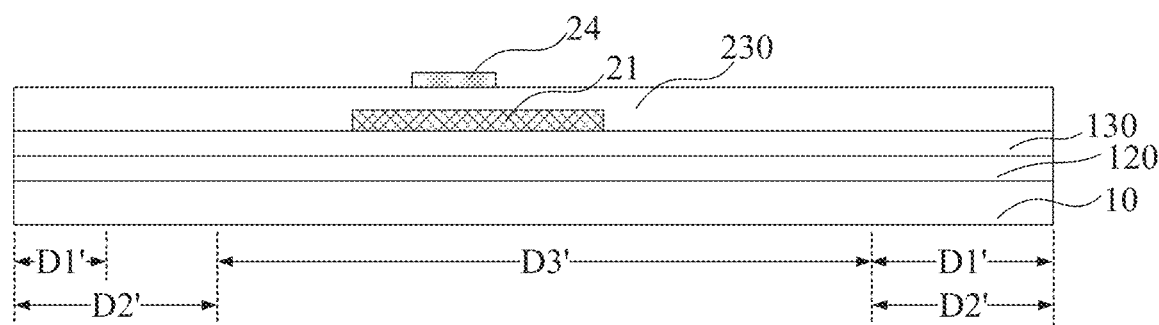
Figure 15E:
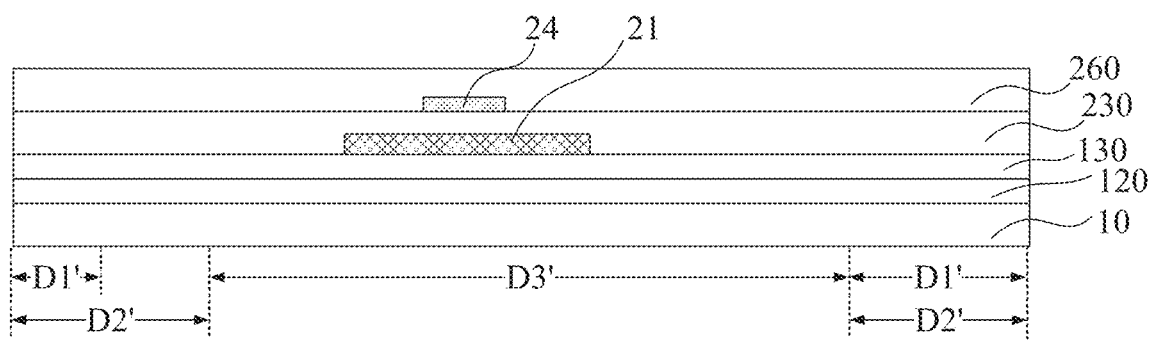
Figure 15F:
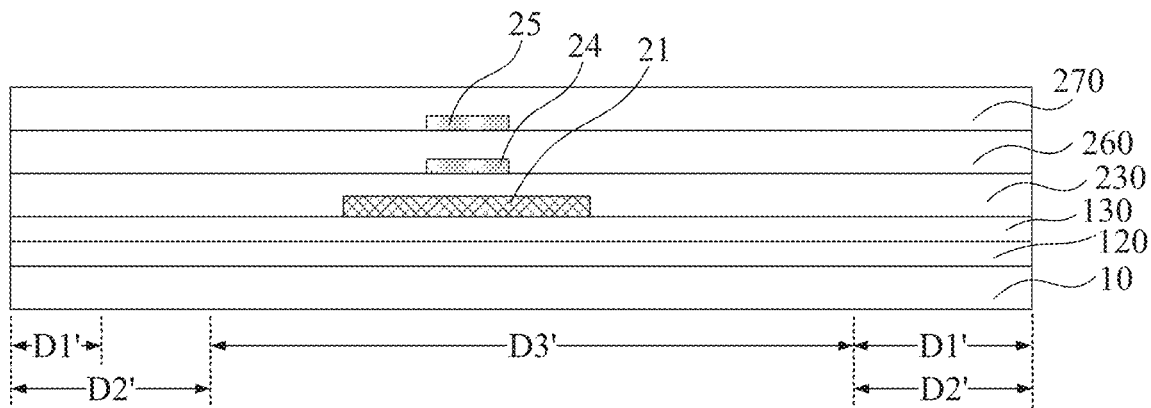
Figure 15G:
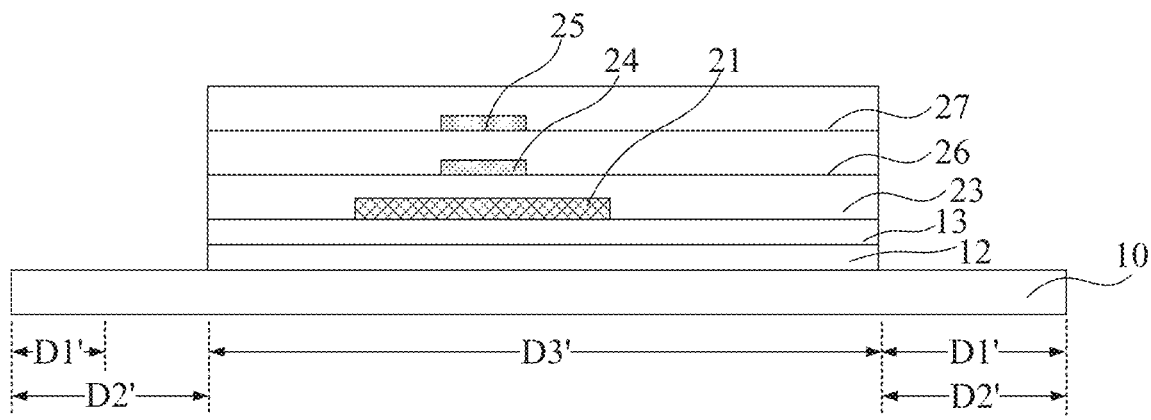
Figure 15H:
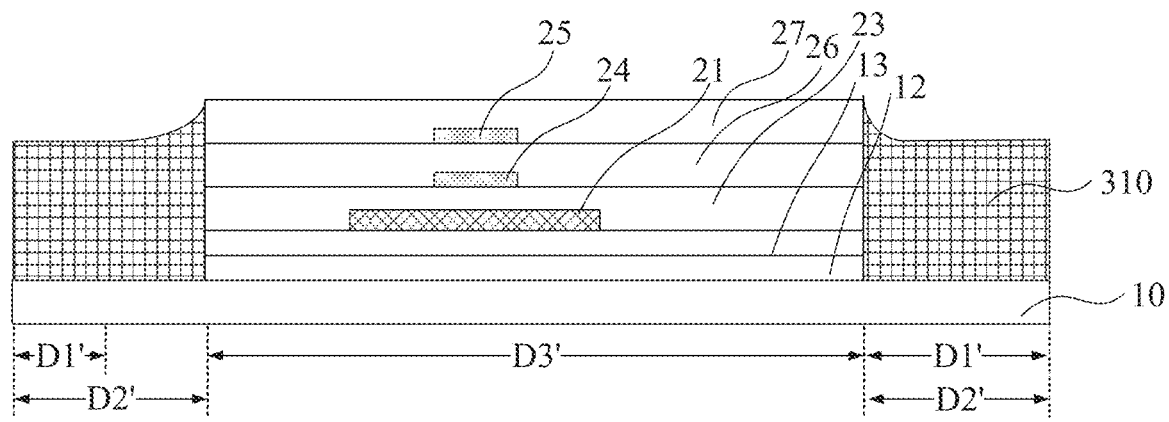

In S200, as shown in FIG. 15H, a first organic film 310 is formed in the gap region D2" between the every two adjacent display unit regions D3'.

For example, the first organic film 310 fills the gap region D2' between the every two adjacent display unit regions D3'.

For example, the first organic film 310 may be made of at least one of: a polymer of polymethyl methacrylate and polystyrene, a polymer and a derivative of phenol groups, a polymer of acryl, a polymer of para-xylene, a polymer of aryl ether, a polymer of amide, a polymer of fluoride, or a polymer of vinyl alcohol.

Figure 8:
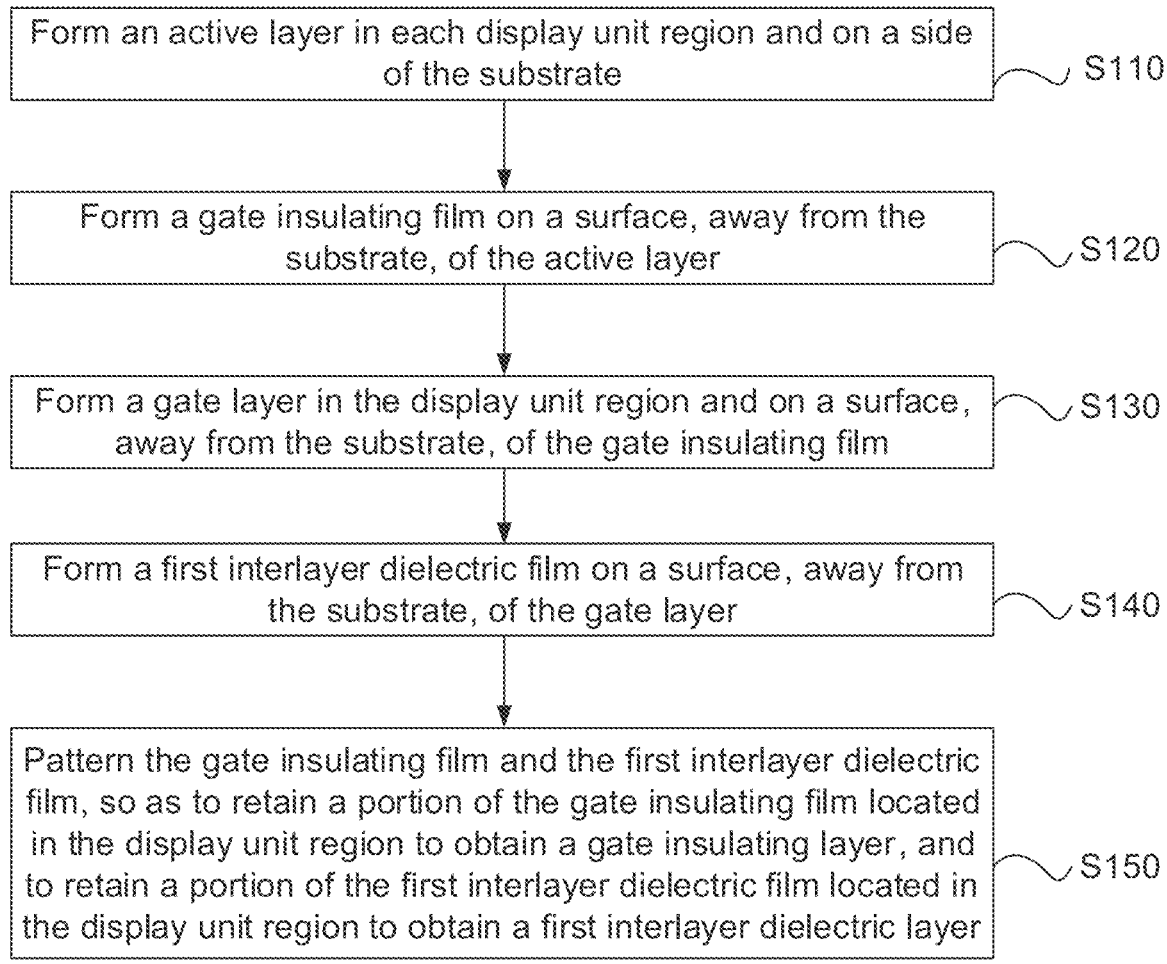
FIG. 8 is a flow diagram of another method for manufacturing a display panel, in accordance with embodiments of the present disclosure.

In some examples, after the substrate 10 is provided and before S200, as shown in FIG. 8, the method further includes S110 to S150.

In S110, as shown in FIG. 15B, an active layer 21 is formed in each display unit region D3" and on a side of the substrate 10.

For example, an active film may be formed through a sputtering process, and then the active film is patterned through a photolithography process to form a plurality of active patterns 211 arranged at intervals to obtain the active layer 21.

For example, the active layer 21 may be made of polycrystalline silicon or the like.

In S120, as shown in FIG. 15C, a gate insulating film 230 is formed on a surface, away the substrate 10, of the active layer 21.

For example, the gate insulating film 230 may be formed through a deposition process.

For example, the gate insulating film 230 may be made of an inorganic material such as silicon oxide (SiO), silicon nitride (SiN), or silicon oxynitride (SiON), or an inorganic semiconductor material such as amorphous silicon or polycrystalline silicon, or an organic semiconductor material, or an oxide-containing semiconductor material such as an oxide of a metal element such as zinc (Zn), indium (In), or gallium (Ga).

In S130, as shown in FIG. 15D, a gate layer 24 is formed in the display unit region D3' and on a surface, away from the substrate 10, of the gate insulating film 230.

For example, a gate film may be formed through a sputtering process, and then the gate film is patterned through a photolithography process to form a plurality of gates 241 arranged at intervals to obtain the gate layer 24.

For example, the gate layer 24 may be made of a conductive metal such as titanium (Ti), aluminum (Al), molybdenum (Mo), or silver (Ag), or a conductive oxide such as indium tin oxide (ITO), indium zinc oxide (IZO), zinc oxide (ZnO), indium oxide ($In_2O_3$), indium gallium oxide (IGO), or aluminum zinc oxide (AZO), or a conductive material with high ductility such as rubber mixed with conductive particles, or a carbon nanotube.

In S140, as shown in FIG. 15F, a first interlayer dielectric film 270 is formed on a surface, away from the substrate 10, of the gate layer 24.

For example, the first interlayer dielectric film 270 may be formed through a deposition process.

For example, the first interlayer dielectric film 270 may be made of an inorganic material such as SiO, SiN or SiON, or an inorganic semiconductor material such as amorphous silicon or polycrystalline silicon, or an organic semiconductor material, or an oxide-containing semiconductor material such as an oxide of a metal element such as Zn, In or Ga.

In S150, as shown in FIG. 15G, the gate insulating film 230 and the first interlayer dielectric film 270 are patterned, so as to retain a portion of the gate insulating film 230 located in the display unit region D3' to obtain a gate insulating layer 23, and to retain a portion of the first interlayer dielectric film 270 located in the display unit region D3' to obtain a first interlayer dielectric layer 27.

For example, the gate insulating film 230 and the first interlayer dielectric film 270 may be patterned through a photolithography process. When the gate insulating film 230 and the first interlayer dielectric film 270 are patterned, a portion of the gate insulating film 230 in the gap region D2' and a portion of the first interlayer dielectric film 270 in the gap region D2' may be removed simultaneously.

Figure 9:
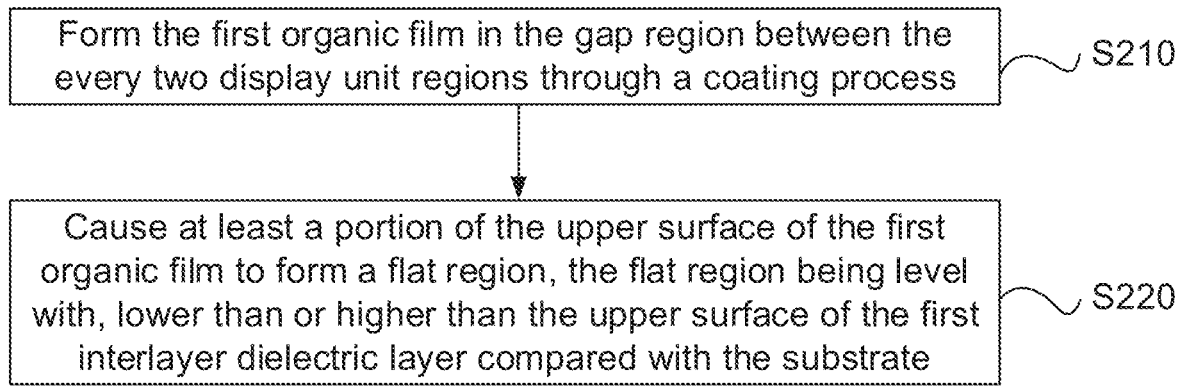
FIG. 9 is a flow diagram of S200 in the flow diagram shown in FIG. 7.

For example, forming the first organic film 310, as shown in FIG. 9, may include S210 to S220.

In S210, the first organic film 310 is formed in the gap region D2' between the every two adjacent display unit region D3' through a coating process.

For example, the coating process includes a spin coating process or a blade coating process.

For example, compared with the substrate 10, a height of a surface (referred to as an upper surface hereinafter), away from the substrate 10, of the first organic film 310 is greater than a height of a surface (referred to as an upper surface hereinafter), away from the substrate 10, of each of the two adjacent first interlayer dielectric layers 27.

In S220, at least a portion of the upper surface of the first organic film 310 is caused to form a flat region. The flat region is level with the upper surface of the first interlayer dielectric layer 27 compared with the substrate 10; or as shown in FIG. 15H, the flat region is lower than the upper surface of the first interlayer dielectric layer 27 compared with the substrate 10; or the flat region is higher than the upper surface of the first interlayer dielectric layer 27 compared with the substrate 10.

For example, the first organic film 310 may be patterned by using a phase shift mask or a halftone mask to obtain the flat region, and further obtain first transition regions or second transition regions of the first organic film 310.

For example, for structures of the flat region, the first transition regions and the second transition regions, references may be made to the schematic description in some examples described above, and details will not be repeated herein.

Figure 15I:
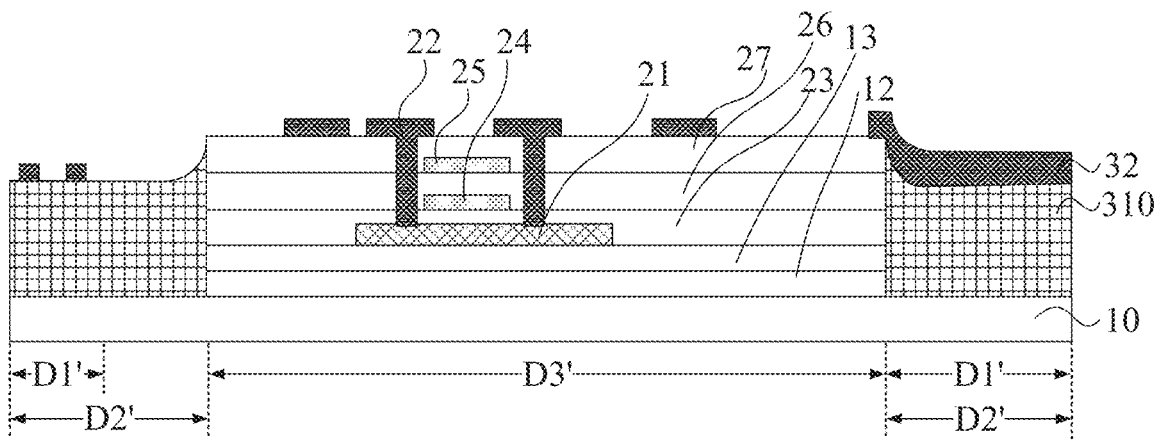

In S300, as shown in FIG. 15I, a conductive layer 32 is formed in the connection unit region D1' and on a surface, away from the substrate 10, of the first organic film 310.

For example, a conductive film may be formed through a sputtering process, and then the conductive film is patterned through a photolithography process to form the conductive layer 32.

Figure 10:
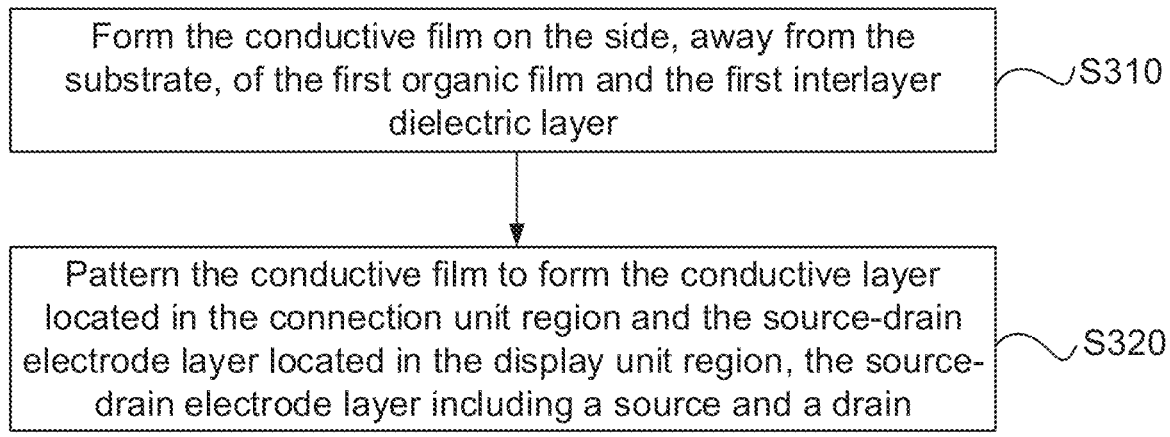
FIG. 10 is a flow diagram of S300 in the flow diagram shown in FIG. 7.

In some examples, as shown in FIG. 10, in a case where the display unit D3 in the display panel 100 includes a source-drain electrode layer, S300, in which the conductive layer 32 is formed, may include S310 to S320.

In S310, the conductive film is formed on the surface, away from the substrate 10, of the first organic film 310 and the first interlayer dielectric layer 27.

For example, the conductive film may be formed through the sputtering process.

For example, the conductive film may be made of a conductive metal such as Ti, Al, Mo or Ag, or a conductive oxide such as ITO, IZO, ZnO, $In_2O_3$, IGO or AZO, or a conductive material with high ductility such as rubber mixed with conductive particles, or a carbon nanotube.

In S320, the conductive film is patterned to form the conductive layer 32 located in the connection unit region D1' and the source-drain electrode layer located in the display unit region D3', the source-drain electrode layer including a source and a drain.

For example, the conductive film may be patterned through the photolithography process to form the conductive layer 32, the source and the drain.

Figure 15J:
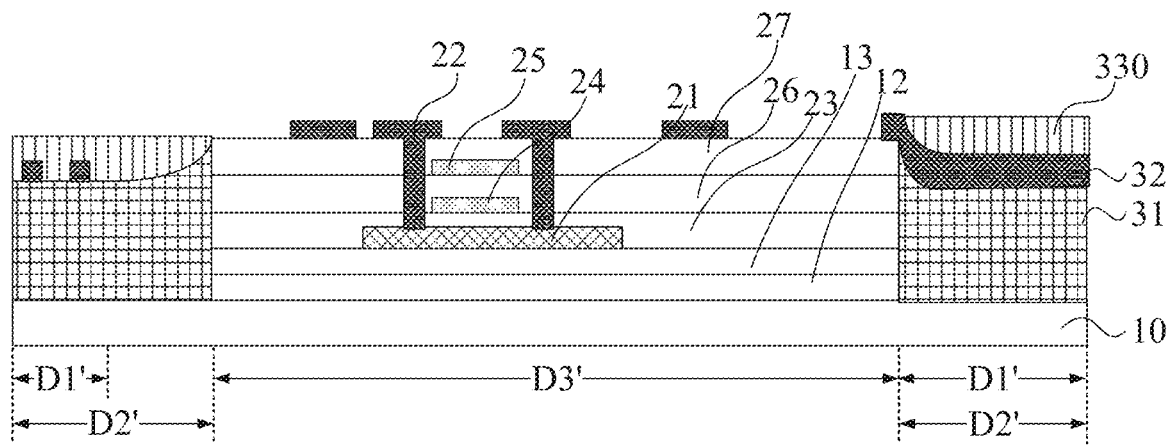

In S400, as shown in FIG. 15J, a second organic film 330 is formed in the gap region D2' and on a surface, away from the substrate 10, of the conductive layer 32.

For example, the second organic film 330 covers the conductive layer 32.

For example, the second organic film 330 may be formed through a coating process.

For example, the second organic film 330 may be made of at least one of: a polymer of polymethyl methacrylate and polystyrene, a polymer and a derivative of phenol groups, a polymer of acryl, a polymer of para-xylene, a polymer of aryl ether, a polymer of amide, a polymer of fluoride, or a polymer of vinyl alcohol.

Figures 1, 15K:
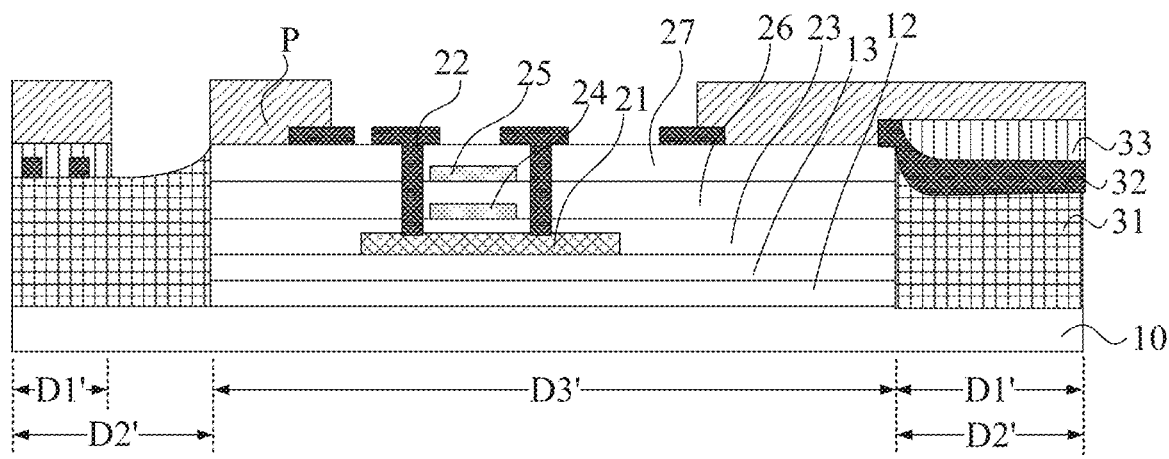
Figures 2, 15K:
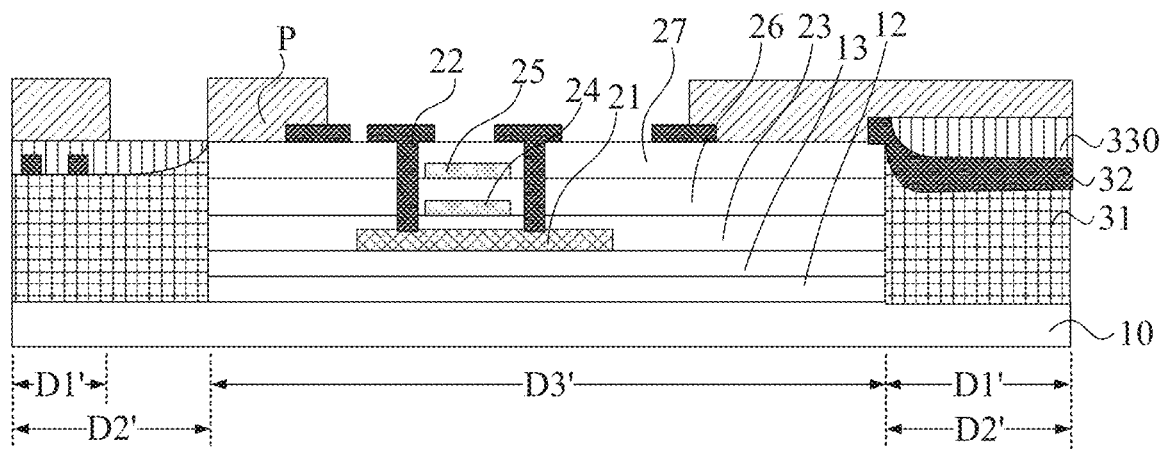
Figures 1, 15L:
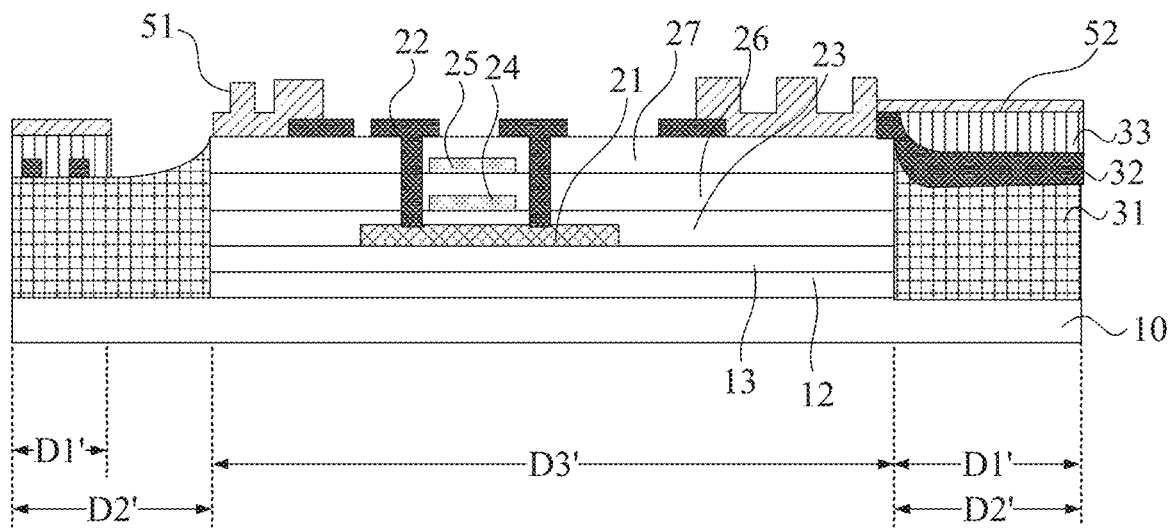
Figures 2, 15L:
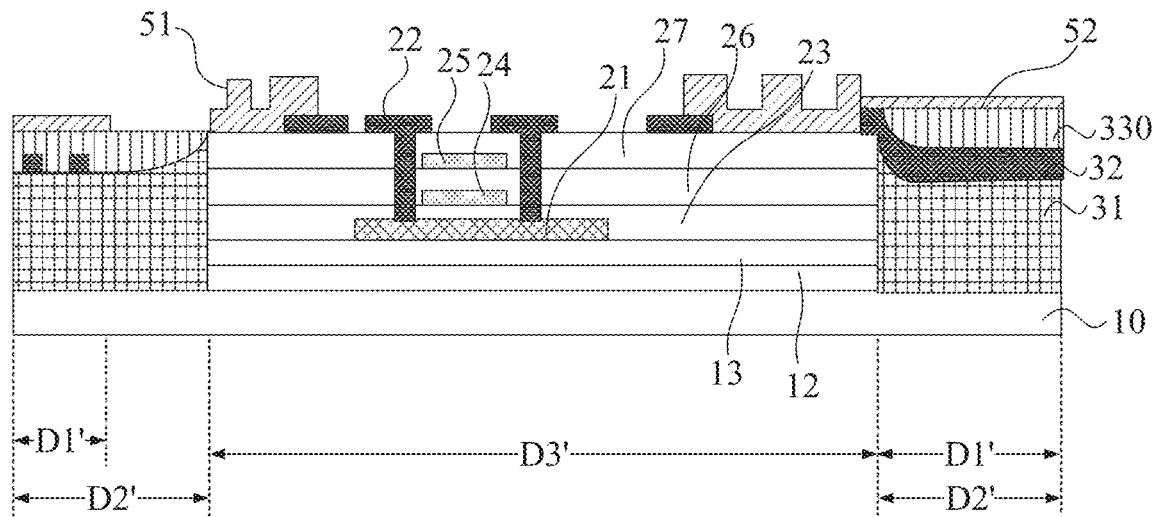
Figure 15M:
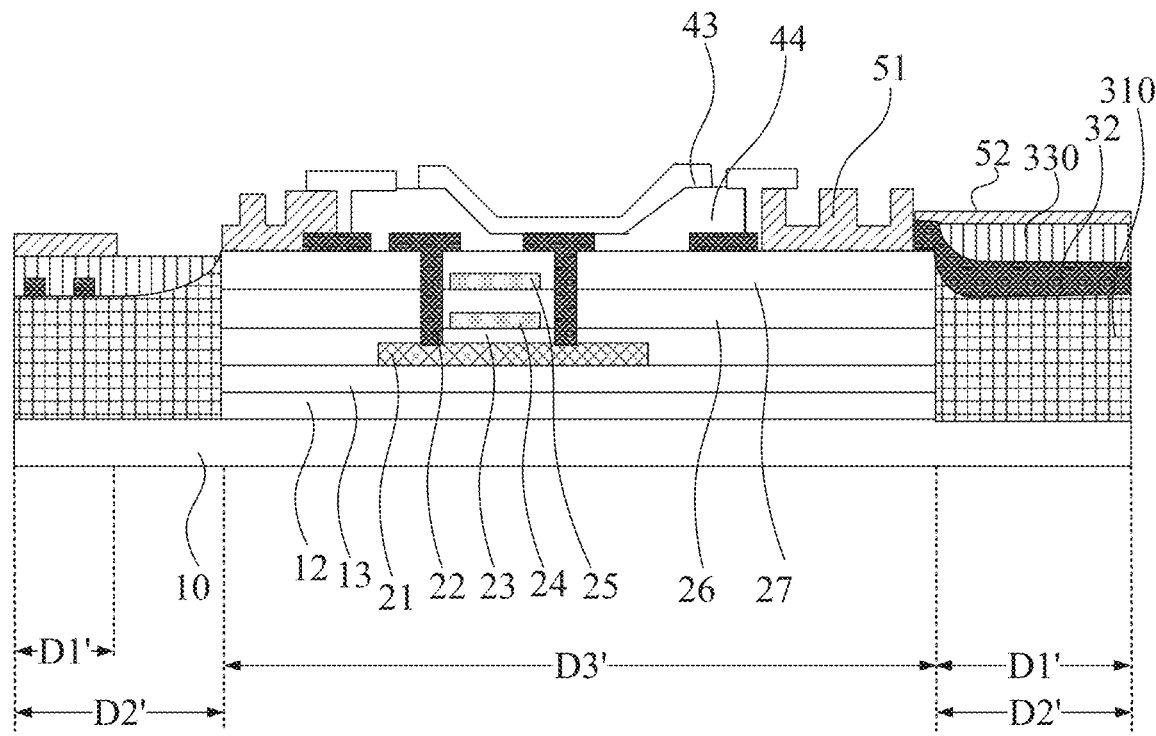
Figure 15N:
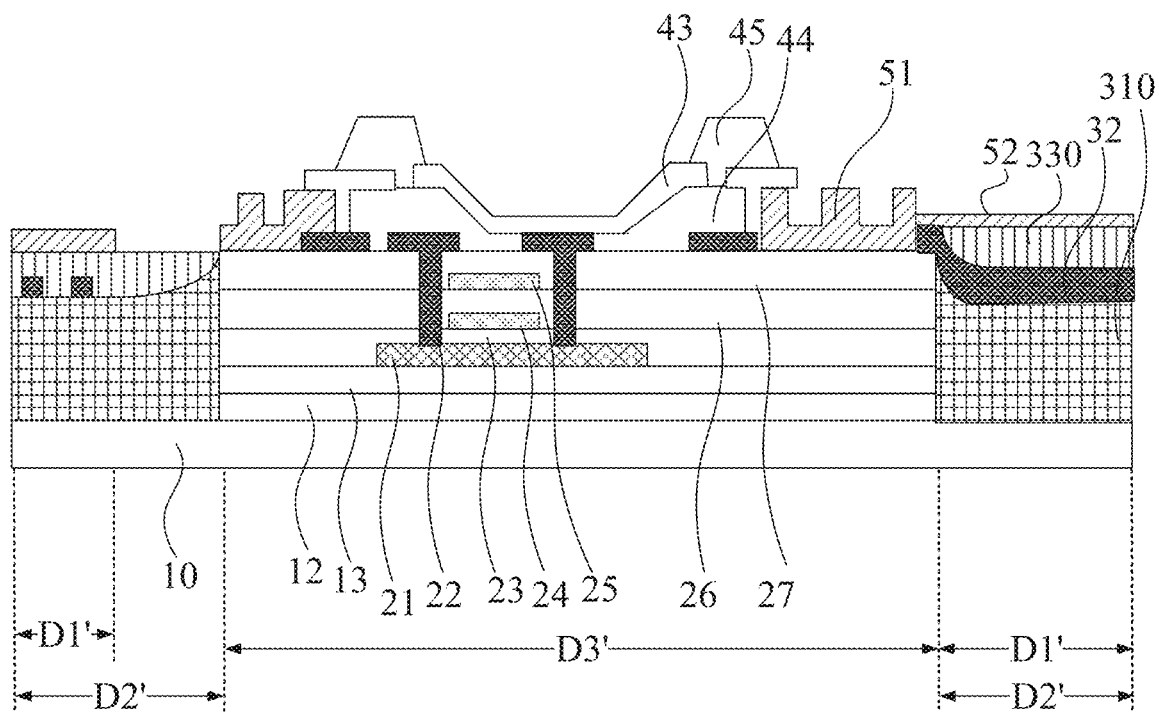
Figure 15O:
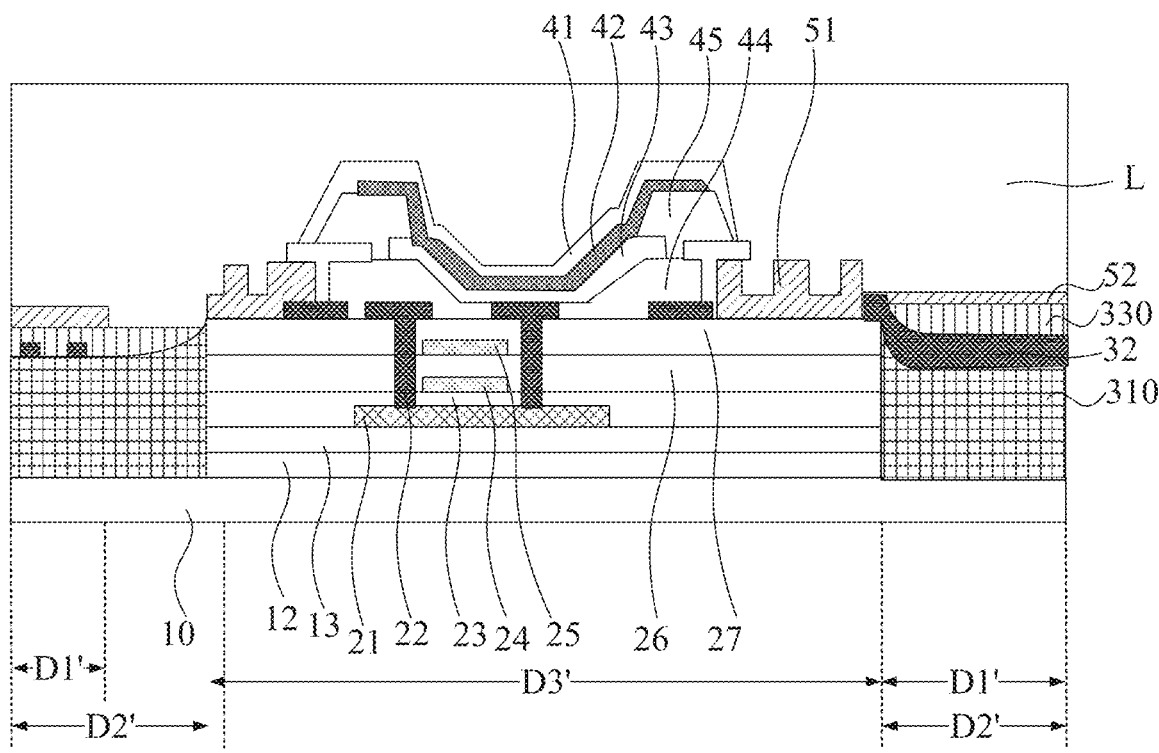
Figure 15P:
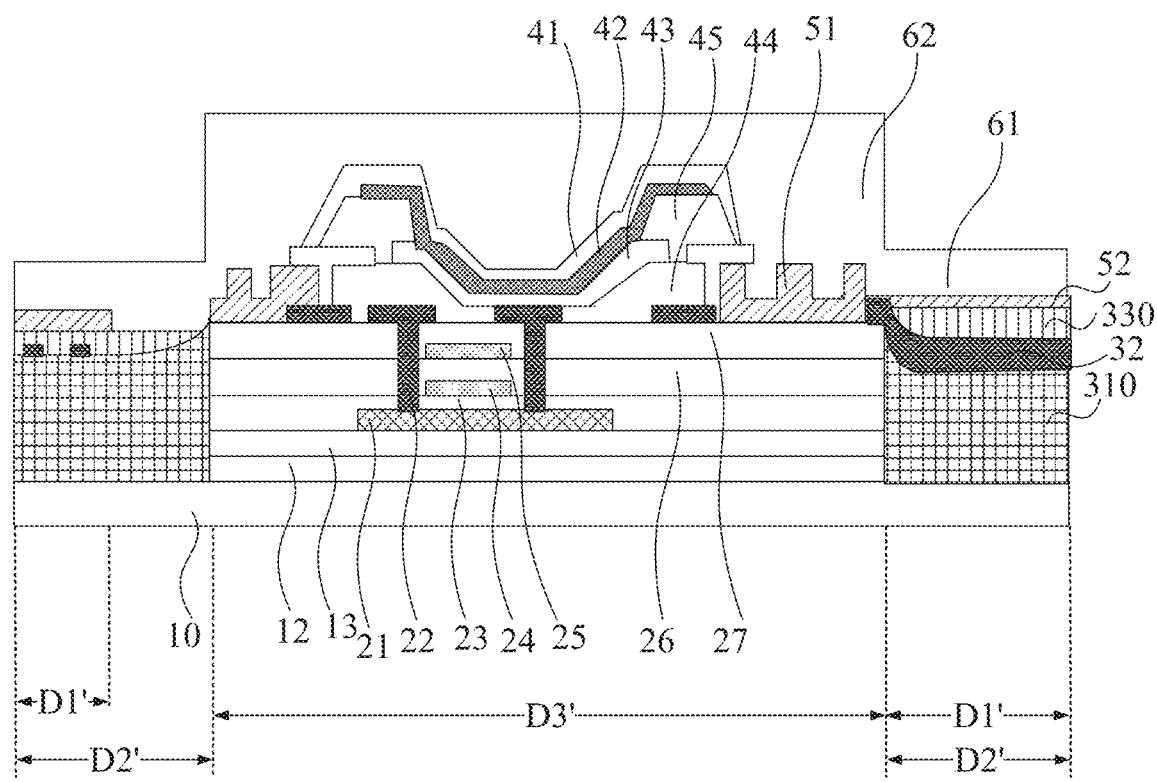
Figure 15Q:
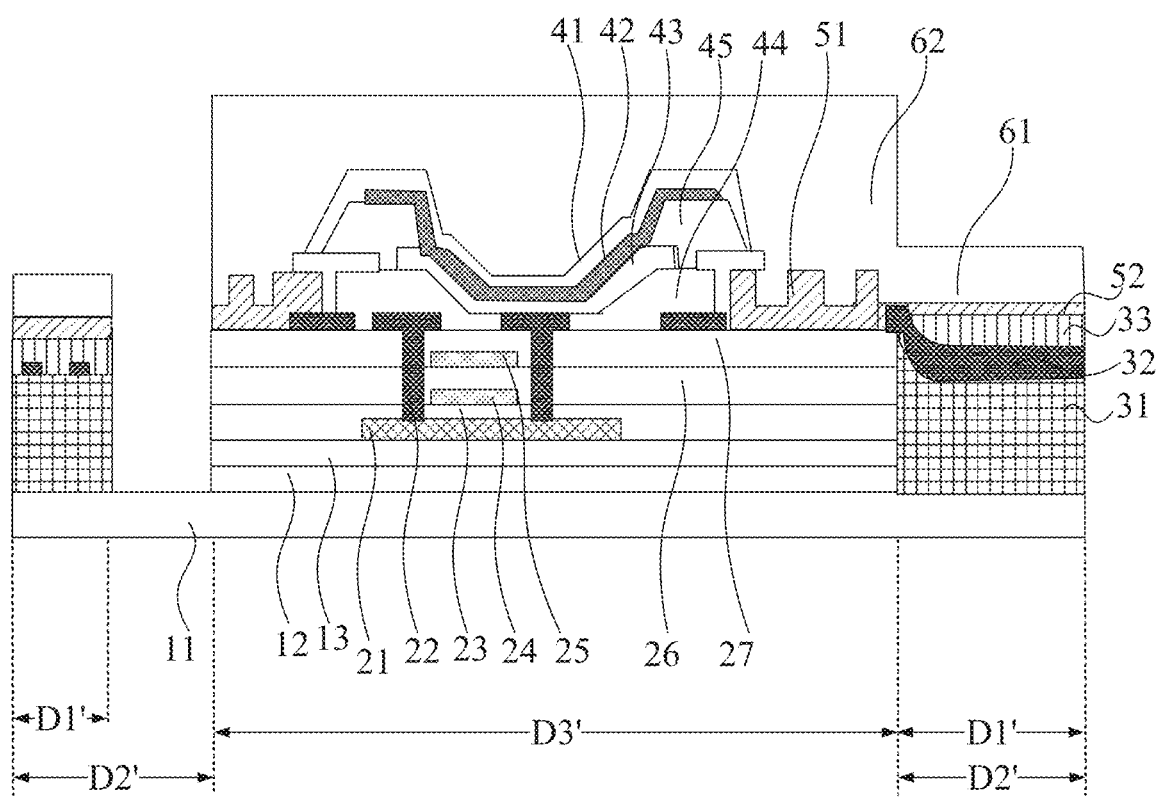

In S500, as shown in FIG. 15Q, the first organic film 310 and the second organic film 330 are patterned, so as to retain a portion of the first organic film 310 located in the connection unit region D1' to obtain a first organic layer 31, and to retain a portion of the second organic film 330 located in the connection unit region D1 to obtain a second organic layer 33.

For example, the first organic film 310 and the second organic film 330 may be patterned through a photolithography process to obtain the first organic layer 31 and the second organic layer 33.

Beneficial effects that may be achieved by the method for manufacturing the display panel provided by some embodiments of the present disclosure are the same as those that may be achieved by the display panel provided by some embodiments described above, and details will not be repeated herein.

Figure 11:
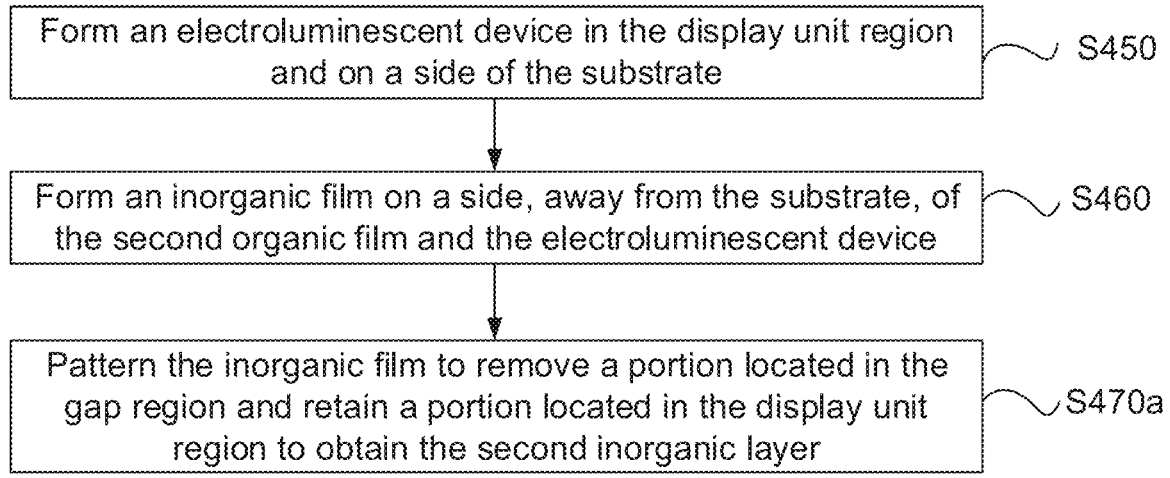
FIG. 11 is a flow diagram of yet another method for manufacturing a display panel, in accordance with embodiments of the present disclosure.
Figure 12:
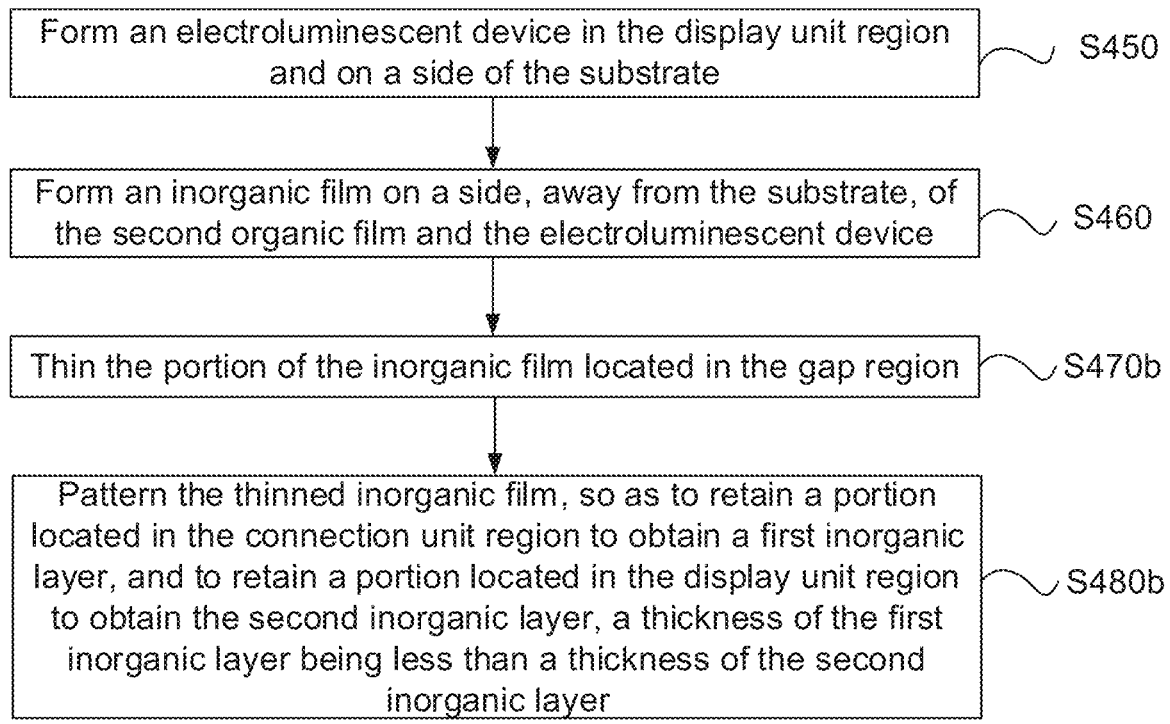
FIG. 12 is a flow diagram of yet another method for manufacturing a display panel, in accordance with embodiments of the present disclosure.

In some examples, as shown in FIGS. 11 and 12, before the first organic film 310 and the second organic film 330 are patterned, the method further includes S450 to S470a or S450 to S480b.

In S450, as shown in FIGS. 15M and 15N, an electroluminescent device 4 is formed in the display unit region D3' and on a side of the substrate 10.

For example, the electroluminescent device 4 may include an anode 43, a light-emitting layer 42, and a cathode 41.

For example, the anode 43 and the cathode 41 may be formed through a sputtering process. For example, the anode layer and the cathode layer may each be made of a conductive metal such as Ti, Al, Mo or Ag, or a conductive oxide such as ITO, IZO, ZnO, In2O3, IGO or AZO.

For example, the light-emitting layer 42 may be formed through an inkjet printing process.

For example, the light-emitting layer 42 may be made of a phosphorescent light-emitting material or a fluorescent light-emitting material.

For example, before the electroluminescent device is formed, a planarization layer 44 and a pixel defining layer 45 are sequentially formed on a side, away from the substrate 10, of the first interlayer dielectric layer 27 in a stacked manner.

For example, the electroluminescent device is formed in each region defined by the pixel defining layer.

For example, both the pixel defining layer 45 and the planarization layer 44 may be formed through a coating process and a photolithography process in sequence.

For example, the pixel defining layer 45 and the planarization layer 44 may be made of the same material or different materials.

For example, the pixel defining layer or the planarization layer may be made of at least one of: a polymer of polymethyl methacrylate and polystyrene, a polymer and a derivative of phenol groups, a polymer of acryl, a polymer of para-xylene, a polymer of aryl ether, a polymer of amide, a polymer of fluoride, or a polymer of vinyl alcohol.

In S460, as shown in FIG. 15O, an inorganic film L is formed on a side, away from the substrate 10 of the second organic film 330 and the electroluminescent device 4.

For example, the inorganic film L covers the second organic film 330 and the electroluminescent device 4.

For example, the inorganic film L may be formed through a deposition process.

For example, the inorganic film L may be made of an inorganic material such as SIO, SiON or SiN, or may be made of aluminum oxide, aluminum nitride, titanium oxide or titanium nitride.

For example, the inorganic film L may have a single-layer structure or a multilayer structure.

Optionally, the inorganic film L may include a first inorganic sub film and a second inorganic sub-film.

Based on this, S460, in which the inorganic film L is formed, may include: first forming the first inorganic sub-film, then forming a third organic film, and then forming the second inorganic sub-film.

For example, the third organic film may be formed through a coating process.

For example, the third organic film may be made of polymethacrylate, polycarbonate, acrylic resin, or epoxy resin.

After the inorganic film L is formed, a second inorganic layer 62 may be formed in various ways.

For example, after S460, the method further includes S470a.

In S470a, the inorganic film L is patterned to remove a portion located in the gap region D2' and retain a portion located in the display unit region D3' to obtain the second inorganic layer 62.

For example, the inorganic film L may be patterned through a photolithography process to obtain the second inorganic layer 62.

For example, after S460, the method further includes S470b to S480b.

In S470b, a portion of the inorganic film L located in the gap region D2' is thinned.

For example, the inorganic film L may be thinned through an etching process.

In S480b, as shown in FIG. 15P, the thinned inorganic film L is patterned, so as to retain a portion located in the connection unit region D1 to obtain a first inorganic layer 61, and to retain a portion located in the display unit region D3' to obtain the second inorganic layer 62, a thickness of the first inorganic layer 61 being less than a thickness of the second inorganic layer 62.

For example, the inorganic film L may be patterned through an etching process.

For structures of the first inorganic layer 61 and the second inorganic layer 62, reference may be made to the description in the above embodiments in the present disclosure, and details will not be repeated herein.

Figure 13:
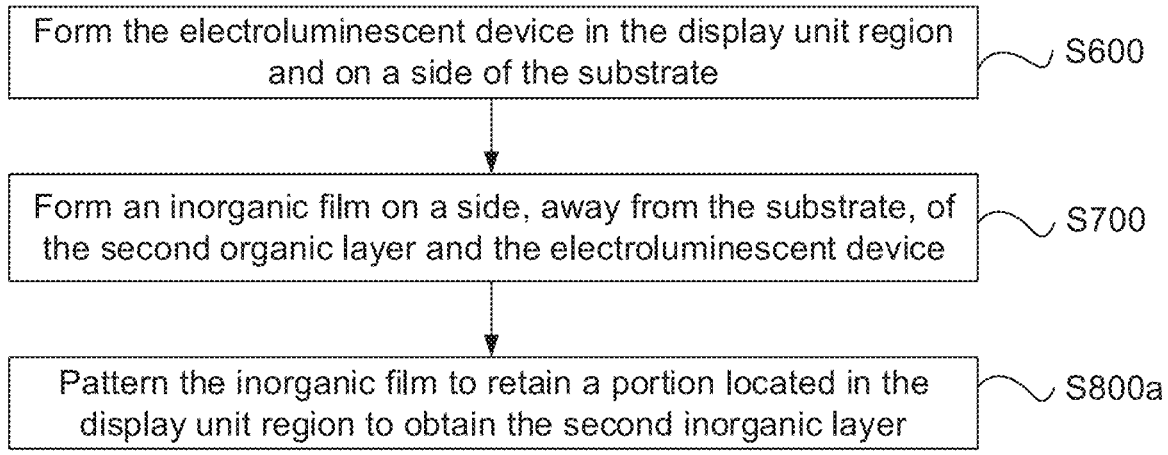
FIG. 13 is a flow diagram of yet another method for manufacturing a display panel, in accordance with embodiments of the present disclosure.
Figure 14:
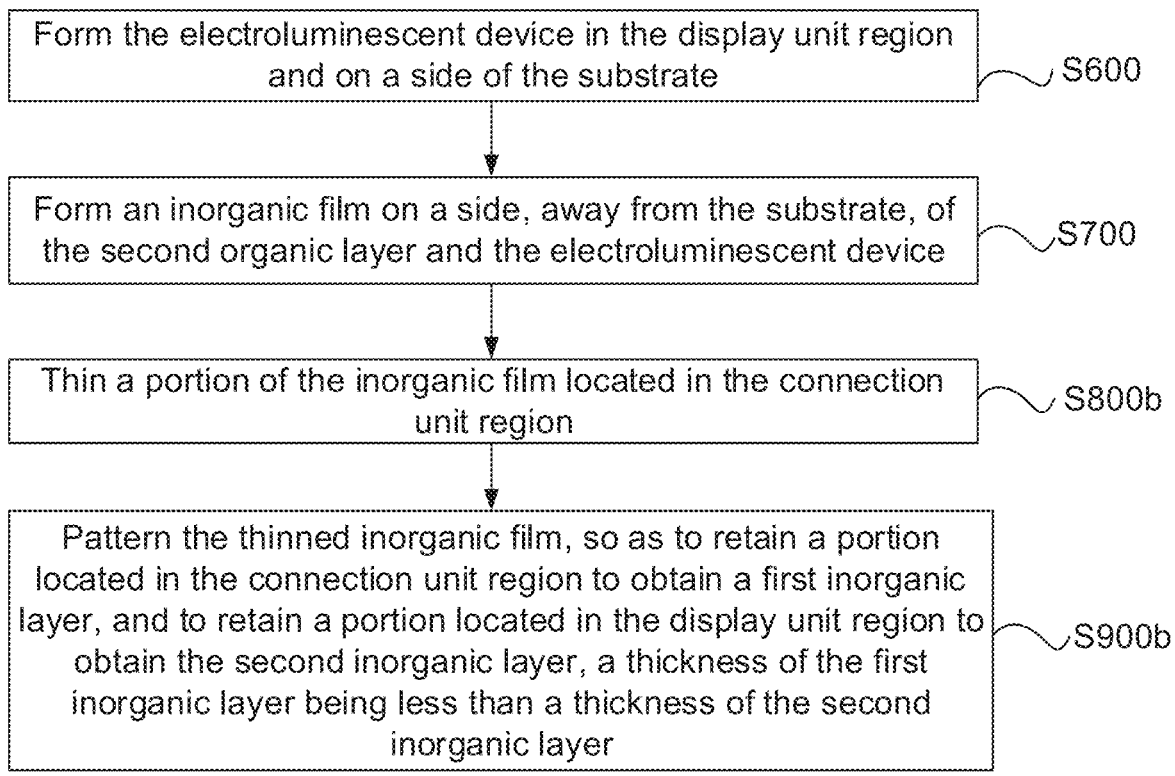
FIG. 14 is a flow diagram of yet another method for manufacturing a display panel, in accordance with embodiments of the present disclosure.

In some embodiments, as shown in FIGS. 13 and 14, before the first organic layer 31 and the second organic layer 33 are obtained, the method further includes S600 to S800a or S600 to S900b.

Figure 16A:
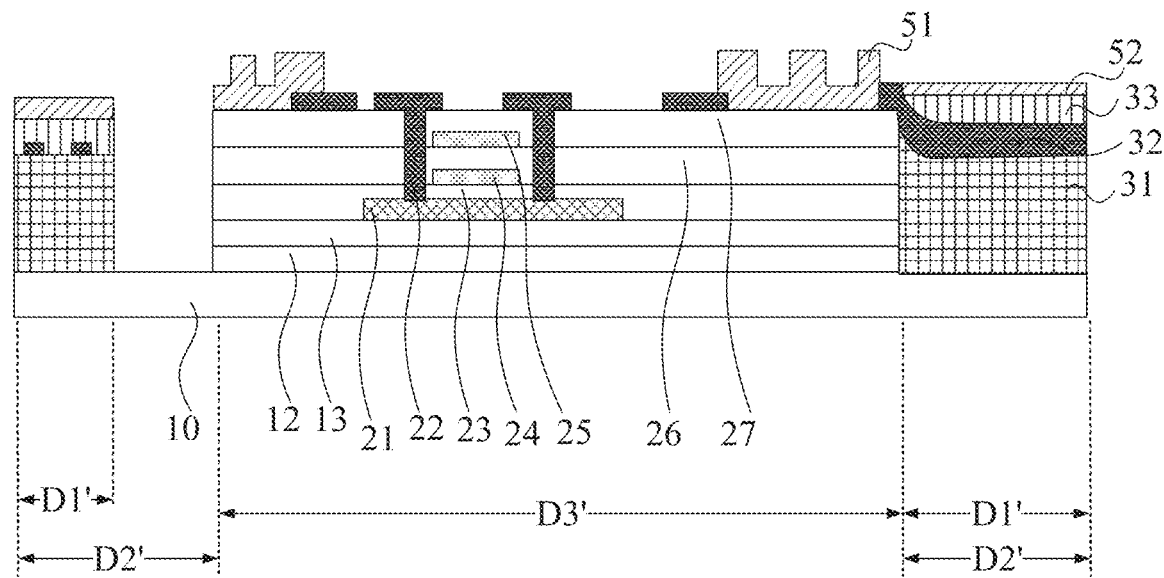
FIGS. 16A to 16E are diagrams showing steps of a method for manufacturing a display panel, in accordance with some other embodiments of the present disclosure.
Figure 16B:
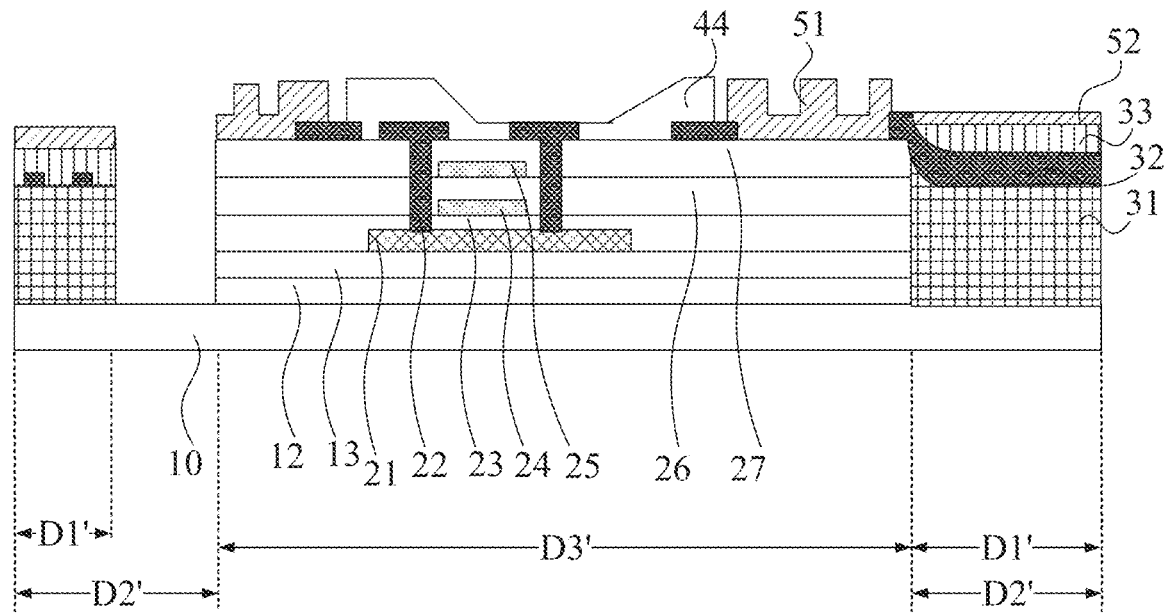
Figure 16C:
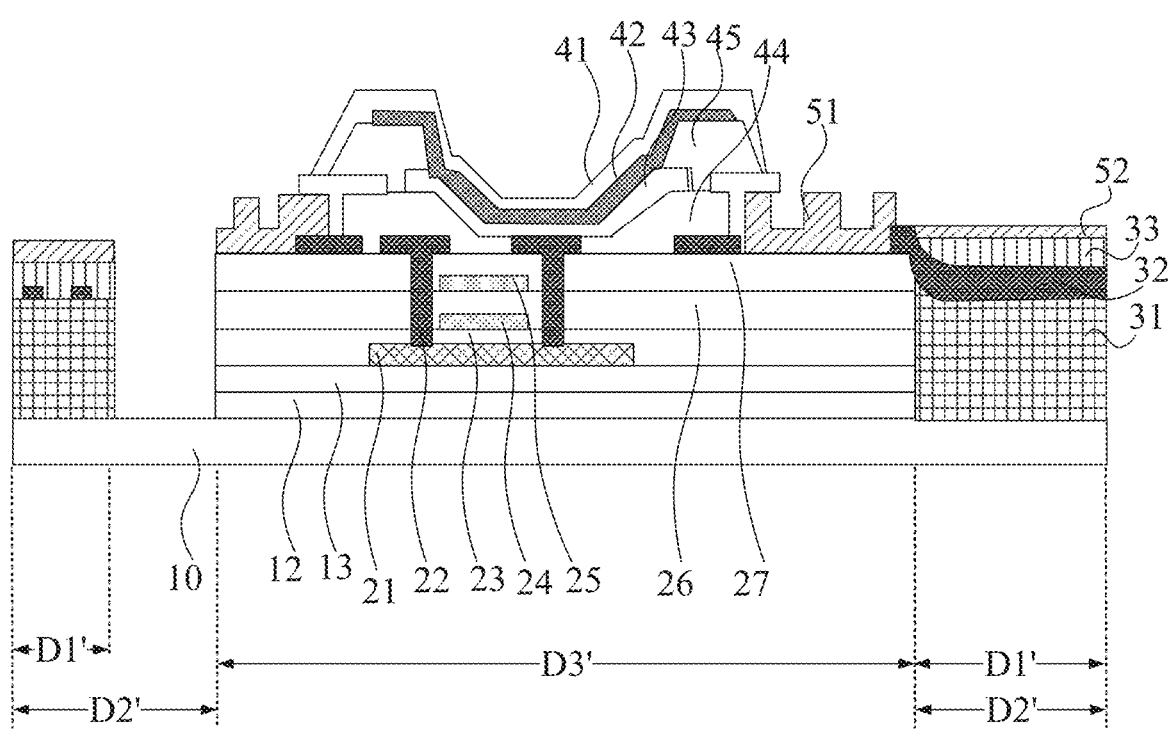

In S600, as shown in FIGS. 16A to 16C, the electroluminescent device 4 is formed in the display unit region D3' and on a side of the substrate 10.

For a structure of the electroluminescent device 4, reference may be made to the description of S450 in the above embodiments, and details will not be repeated herein.

In some examples, before the electroluminescent device 4 is formed, a planarization layer 44 and a pixel defining layer 45 may be sequentially formed in the display unit region D3' in a stacked manner.

For structures of the planarization layer 44 and the pixel defining layer 45, reference may be made to the description of S450 in the above embodiments, and details will not be repeated herein.

Figure 16D:
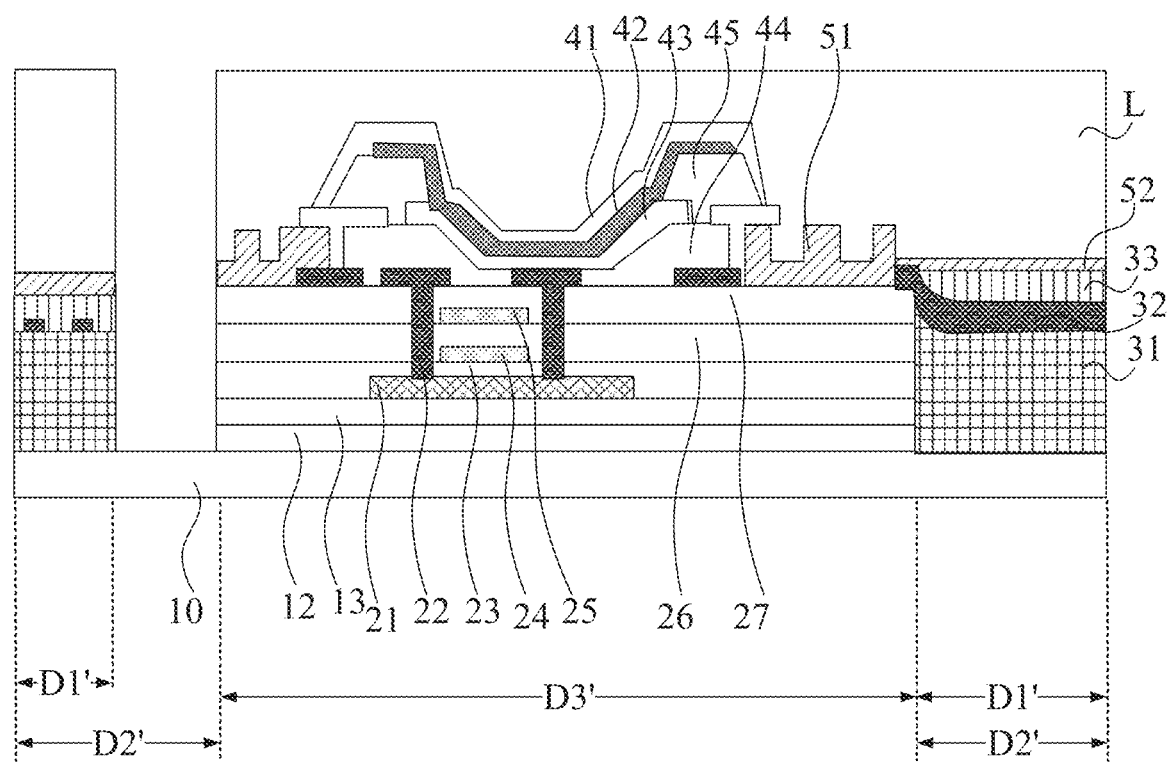

In S700, as shown in FIG. 16D, an inorganic film L is formed on a side, away from the substrate 10, of the second organic layer 33 and the electroluminescent device 4.

For example, the inorganic film L covers the second organic layer 33 and the electroluminescent device 4.

For example, the inorganic film L may be formed through a deposition process.

For example, the inorganic film L may be made of an inorganic material such as SiO, SiON or Silk, or may be made of aluminum oxide, aluminum nitride, titanium oxide or titanium nitride.

After the inorganic film L is formed, the second inorganic layer 62 may be formed in various ways.

For example, after S700, the method further includes S800a.

In S800a, the inorganic film L is patterned to retain a portion located in the display unit region D3' to obtain the second inorganic layer 62.

For example, the inorganic film L may be patterned through a photolithography process.

For example, after S700, the method further includes S800b to S900b.

In S800b, a portion of the inorganic film L located in the connection unit region D1' is thinned.

For example, the inorganic film L may be thinned through an etching process.

In S900b, the thinned inorganic film L is patterned, so as to retain a portion located in the connection unit region D1' to obtain a first inorganic layer 61, and to retain a portion located in the display unit region D3' to obtain the second inorganic layer 62, a thickness of the first inorganic layer 61 being less than a thickness of the second inorganic layer 62.

For example, the inorganic film L may be patterned through a photolithography process.

For the structures of the first inorganic layer 61 and the second inorganic layer 62, reference may be made to the description in the above embodiments of the present disclosure, and details will not be repeated herein.

In some examples, as shown in FIGS. 15K-1 and 15L-1, after the second organic layer 33 is formed, the method further includes: forming a protective film P on a surface, away from the substrate 10, of the second organic layer 33, beside the electroluminescent device 4, and on a surface, away from the substrate 10, of the first interlayer dielectric layer 27, a portion of protective film P located in the display unit region D3' being patterned to obtain a first protective layer 51, and a portion of the protective film P located in the connection unit region D1 being patterned to obtain a second protective layer 52.

In some other examples, as shown in FIGS. 15K-2 and 15L-2, the first protective layer 51 and the second protective layer 52 may also be formed after the second organic film 330 is formed and before the second organic layer 33 is formed.

For example, the protective film P may be formed through a deposition process.

For example, the protective film P may be patterned through an etching process.

For example, the protective film P may be made of an inorganic semiconductor material (e.g., amorphous silicon or polycrystalline silicon), or an organic semiconductor material, or an oxide-containing semiconductor material (e.g., Zn, In or Ga).

For structures of the first protective layer 51 and the second protective layer 52, reference may be made to the description in the above embodiments in the present disclosure, and details will not be repeated herein.

In some embodiments, before the active layer 21 is formed, the method further includes S101 and S151.

In S101, as shown in FIG. 15B, a barrier film 120 and a buffer film 130 are sequentially formed on the substrate 10 in a stacked manner.

For example, both the barrier film 120 and the buffer film 130 may be formed through a deposition process.

For example, the barrier film 120 and the buffer film 130 may each be made of an inorganic material such as SiO, SiN or SiON, or an inorganic semiconductor material (e.g., amorphous silicon or polycrystalline silicon), or an oxide-containing semiconductor material (e.g., an oxide of a metal element such as Zn, In or Ga).

In S151, as shown in FIG. 15G, when the gate insulating film 230 and the first interlayer dielectric film 270 are patterned, the barrier film 120 and the buffer film 130 are patterned simultaneously, so as to retain a portion of the barrier film 120 located in the display unit region D3' to obtain a barrier layer 12, and to retain a portion of the buffer film 130 located in the display unit region D3' to obtain a buffer layer 13.

For example, the barrier film 120 and the buffer film 130 may be patterned through a photolithography process.

For example, when the gate insulating film 230, the first interlayer dielectric film 270, the barrier film 120 and the buffer film 130 are patterned, the photolithography processes may be used multiple times.

In some examples, before the first interlayer dielectric film 270 is formed, the method further includes S131 to S132 and S150.

In S131, as shown in FIG. 15E, a second interlayer dielectric film 260 is formed on a surface, away from the substrate 10, of the gate layer 24.

For example, the second interlayer dielectric film 260 may be formed through a deposition process.

For example, the second interlayer dielectric film 260 may be made of an inorganic material such as SiO, SiN or SiON, or an inorganic semiconductor material (e.g., amorphous silicon or polycrystalline silicon), or an organic semiconductor material, or an oxide-containing semiconductor material (e.g., an oxide of a metal element such as Zn, In or Ga).

In S132, as shown in FIG. 15F, a capacitor electrode layer 25 is formed in the display unit region D3' and on a surface, away from the substrate 10, of the second interlayer dielectric film 260.

For example, a film of the same material as the gate film may be formed through a sputtering process, and then the film is patterned through a photolithography process to form the capacitor electrode layer 25 including a plurality of capacitor electrodes 251 arranged at intervals.

For example, the capacitor electrode layer 25 may be made of a conductive metal such as Ti, Al, Mo or Ag, or a conductive oxide such as ITO, IZO, ZnO, $In_2O_3$, IGO or AZO, or a conductive material with high ductility such as rubber mixed with conductive particles, or a carbon nanotube.

In S150, when the gate insulating film 230 and the first interlayer dielectric film 270 are patterned, the second interlayer dielectric film 260 is patterned simultaneously to retain a portion of the second interlayer dielectric film 260 located in the display unit region D3' to obtain a second interlayer dielectric layer 26.

For example, the gate insulating film 230 and the first interlayer dielectric film 270 may be patterned through a photolithography process.

Figure 16E:
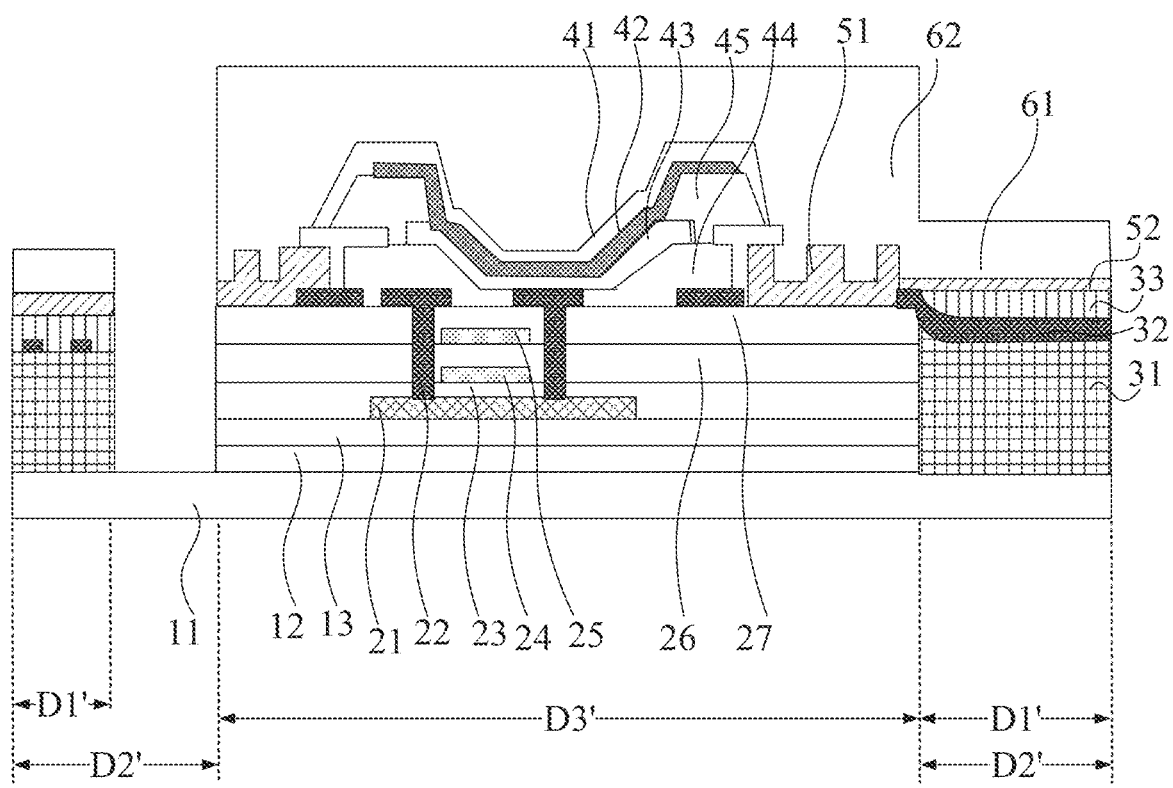

In some embodiments, as shown in FIGS. 16E and 15Q, the method further includes: providing a base 11; separating the substrate 10 from layers formed thereon; and transferring the layers to the base 11 to form the display panel 100.

For a material of the base 11, reference may be made to the schematic description in some examples described above, and details will not be repeated herein.

Figure 17:
FIG. 17 is a schematic diagram showing a structure of a display device, in accordance with embodiments of the present disclosure.

Some embodiments of the present disclosure provide a display device 1000. As shown in FIG. 17, the display device 1000 includes the display panel 100 described in any one of the above embodiments.

Of course, the display device 1000 may further include a bezel, a circuit board, a display driver integrated circuit (IC), and other electronic accessories.

Other indispensable components of the display device will be understood to be desirable by a person of ordinary skill in the art, which will not be repeated herein, and should not be taken as limitations on the present disclosure.

For example, the display device 1000 may be any product or component with a display function, such as a mobile phone, a tablet computer, a television, a display, a notebook computer, a digital camera, or a navigator.

Beneficial effects that may be achieved by the display device provided by some embodiments of the present disclosure are the same as those that may be achieved by the display panel provided in the above embodiments, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a base;
a plurality of display units disposed on a surface of the base, every two adjacent display units being provided with a gap therebetween; and
a connection unit disposed in the gap and connected to the every two adjacent display units, the connection unit including:
a first organic layer, a conductive layer and a second organic layer that are sequentially stacked; wherein
the first organic layer and the second organic layer are each configured to block stress causing the connection unit to deform.

2. The display panel according to claim 1, wherein each display unit includes:
an active layer, a gate insulating layer, a gate layer and a first interlayer dielectric layer that are sequentially stacked on the base: wherein
a surface, away from the base, of the first organic layer includes a flat region; wherein
the flat region is level with a surface, away from the base, of the first interlayer dielectric layer compared with the base, or
the flat region is lower than a surface, away from the base, of the first interlayer dielectric layer compared with the base, or
the flat region is higher than a surface, away from the base, of the first interlayer dielectric layer compared with the base.

3. The display panel according to claim 2, wherein
in a case where the flat region is lower than the surface of the first interlayer dielectric layer, the surface of the first organic layer further includes first transition regions located at two opposite sides of the flat region; wherein
one end of each first transition region is connected to the flat region; and
another end of the first transition region gently rises to a height level with a surface, away from the base, of a first interlayer dielectric layer of a display unit connected to the first transition region, in a direction close to the display unit, and is in contact with the surface of the first interlayer dielectric layer; or another end of the first transition region gently rises to a height greater than that of a surface, away from the base, of a first interlayer dielectric layer of a display unit connected to the first transition region, in a direction close to the display unit, and overlaps an edge of the surface of the first interlayer dielectric layer;
or
in a case where the flat region is higher than the surface of the first interlayer dielectric layer, the surface of the first organic layer further includes second transition regions located at two opposite sides of the flat region; wherein
one end of each second transition region is connected to the flat region; and
another end of the second transition region gently descends to a height level with a surface, away from the base, of a first interlayer dielectric layer of a display unit connected to the second transition region, in a direction close to the display unit, and is in contact with the surface of the first interlayer dielectric layer; or another end of the second transition region gently descends to a height greater than that of a surface, away from the base; of a first interlayer dielectric layer of a display unit connected to the second transition region, in a direction close to the display unit, and overlaps an edge of the surface of the first interlayer dielectric layer.

4. The display panel according to claim 2, wherein the display unit further includes a source-drain electrode layer disposed on the surface of the first interlayer dielectric layer, the source-drain electrode layer includes;
a source and a drain; and
the conductive layer of the connection unit and the source-drain electrode layer are disposed in a same layer.

5. The display panel according to claim 2, wherein the display unit further includes:
a barrier layer and a buffer layer that are sequentially stacked between the base and the active layer; and/or
a second interlayer dielectric layer and a capacitor electrode layer that are sequentially stacked between the gate insulating layer and the first interlayer dielectric layer.

6. The display panel according to claim 1, wherein the connection unit further includes a first inorganic layer disposed on a surface, away from the base, of the second organic layer; and each display unit includes: an electroluminescent device and a second inorganic layer that are sequentially stacked, a thickness of the first inorganic layer is less than a thickness of the second inorganic layer.

7. The display panel according to claim 6, wherein the second inorganic layer includes: a first inorganic sub-layer and a second inorganic sub-layer that are sequentially stacked;

the display unit further includes a third organic layer disposed between the first inorganic sub-layer and the second inorganic sub-layer.

8. The display panel according to claim 6, wherein the first inorganic layer and the second inorganic layer are made of a same material.

9. The display panel according to claim 6, wherein the first inorganic layer and at least a portion of the second inorganic layer are disposed in a same layer.

10. The display panel according to claim 6, wherein the display unit further includes a first protective layer disposed between the electroluminescent device and the base and located beside the electroluminescent device; wherein a surface, away from the base, of the first protective layer is provided with a plurality of grooves.

11. The display panel according to claim 10, wherein the connection unit further includes a second protective layer disposed between the second organic layer and the first inorganic layer, the second protective layer and the first protective layer are disposed in a same layer.

12. The display panel according to claim 1, wherein the first organic layer or the second organic layer is made of at least one of:

a polymer of polymethyl methacrylate and polystyrene,
a polymer and a derivative of phenol groups,
a polymer of acryl,
a polymer of para-xylene,
a polymer of aryl ether,
a polymer of amide,
a polymer of fluoride, or
a polymer of vinyl alcohol.

13. A method for manufacturing a display panel, the method comprising:

providing a substrate, the substrate having: a plurality of display unit regions and a gap region between every two adjacent display unit regions, and the gap region including a connection unit region located between the every two adjacent display unit regions and connected to the every two adjacent display unit regions;

forming a first organic film in the gap region between the every two adjacent display unit regions;

forming a conductive layer in the connection unit region and on a surface, away from the substrate, of the first organic film;

forming a second organic film in the gap region and on a surface, away from the substrate; of the conductive layer; and patterning the first organic film and the second organic film, so as to retain a portion of the first organic film located in the connection unit region to obtain a first organic layer, and to retain a portion of the second organic film located in the connection unit region to obtain a second organic layer.

14. The method according to claim 13, wherein before the first organic film is formed in the gap region between the every two adjacent display unit regions, the method further comprises:

forming an active layer in each display unit region and on a side of the substrate;

forming a gate insulating film on a surface, away from the substrate, of the active layer;

forming a gate layer in the display unit region and on a surface, away from the substrate, of the gate insulating film;

forming a first interlayer dielectric film on a surface; away from the substrate, of the gate layer; and patterning the gate insulating film and the first interlayer dielectric film, so as to retain a portion of the gate insulating film located in the display unit region to obtain a gate insulating layer, and to retain a portion of the first interlayer dielectric film located in the display unit region to obtain a first interlayer dielectric layer;

forming the first organic film includes:

forming the first organic film in the gap region between the every two adjacent display unit regions through a coating process;

causing at least a portion of a surface, away from the substrate, of the first organic film to form a flat region, wherein the flat region is level with a surface, away from the base, of the first interlayer dielectric layer compared with the substrate, or the flat region is lower than a surface, away from the base, of the first interlayer dielectric layer compared with the substrate, or the flat region is higher than a surface, away from the base, of the first interlayer dielectric layer compared with the substrate.

15. The method according to claim 14, wherein forming the conductive layer includes:

forming a conductive film on the surface, away from the substrate, of the first organic film and on the surface, away from the substrate, of the first interlayer dielectric layer; and patterning the conductive film to form the conductive layer located in the connection unit region and a source-drain electrode layer located in the display unit region, the source-drain electrode layer including a source and a drain.

16. The method according to claim 14, wherein before the active layer is formed, the method further comprises:

forming a barrier film and a buffer film sequentially on the substrate in a stacked manner; and when the gate insulating film and the first interlayer dielectric film are patterned, patterning the barrier film and the buffer film simultaneously, so as to retain a portion of the barrier film located in the display unit region to obtain a barrier layer, and to retain a portion of the buffer film located in the display unit region to obtain a buffer layer;

and/or before the first interlayer dielectric film is formed, the method further comprises:

forming a second interlayer dielectric film on a surface, away from the substrate, of the gate layer;

forming a capacitor electrode layer in the display unit region and on a surface, away from the substrate, of the second interlayer dielectric film; and when the gate insulating film and the first interlayer dielectric film are patterned, patterning the second interlayer dielectric film simultaneously, so as to retain a portion of the second interlayer dielectric film located in the display unit region to obtain a second interlayer dielectric layer.

17. The method according to claim 13, wherein before the first organic film and the second organic film are patterned, the method further comprises:
   forming an electroluminescent device in each display unit region and on a side of the substrate; and
   forming an inorganic film on a side, away from the substrate, of the second organic film and the electroluminescent device:
   the method further comprises:
   patterning the inorganic film to remove a portion located in the gap region and retain a portion located in the display unit region to obtain a second inorganic layer;
   or
   thinning a portion of the inorganic film located in the gap region; and
   patterning the thinned inorganic film, so as to retain a portion located in the connection unit region to obtain a first inorganic layer, and to retain a portion located in the display unit region to obtain a second inorganic layer, a thickness of the first inorganic layer being less than a thickness of the second inorganic layer.

18. The method according to claim 13, wherein after the first organic layer and the second organic layer are formed, the method further comprises:
   forming an electroluminescent device in each display unit region and on a side of the substrate; and
   forming an inorganic film on a side, away from the substrate, of the second organic layer and the electroluminescent device;
   the method further comprises:
   patterning the inorganic film, so as to retain a portion located in the display unit region to obtain a second inorganic layer;
   or
   thinning a portion of the inorganic film located in the connection unit region; and
   patterning the thinned inorganic film, so as to retain a portion located in the connection unit region to obtain a first inorganic layer, and to retain a portion located in the display unit region to obtain the second inorganic layer, a thickness of the first inorganic layer being less than a thickness of the second inorganic layer.

19. The method according to claim 13, further comprising:
   providing a base;
   separating the substrate from layers formed thereon; and
   transferring the layers to the base to form the display panel.

20. A display device, comprising the display panel according to claim 1.

* * * * *